(12) United States Patent
Park et al.

(10) Patent No.: US 11,988,893 B2
(45) Date of Patent: May 21, 2024

(54) LENS MOVING APPARATUS AND CAMERA MODULE INCLUDING THE SAME

(71) Applicant: LG INNOTEK CO., LTD., Seoul (KR)

(72) Inventors: Sang Ok Park, Seoul (KR); Seong Min Lee, Seoul (KR); Jun Taek Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 24 days.

(21) Appl. No.: 17/660,762

(22) Filed: Apr. 26, 2022

(65) Prior Publication Data

US 2022/0260804 A1 Aug. 18, 2022

Related U.S. Application Data

(63) Continuation of application No. 16/372,859, filed on Apr. 2, 2019, now Pat. No. 11,347,022, which is a
(Continued)

(30) Foreign Application Priority Data

Aug. 7, 2014 (KR) .................. 10-2014-0101504
Aug. 25, 2014 (KR) .................. 10-2014-0110515

(51) Int. Cl.
*G02B 7/09* (2021.01)
*G02B 7/08* (2021.01)
(Continued)

(52) U.S. Cl.
CPC ............... *G02B 7/09* (2013.01); *G02B 7/08* (2013.01); *G02B 7/102* (2013.01); *H05K 9/0058* (2013.01)

(58) Field of Classification Search
CPC .......... G02B 7/105; G02B 15/22; G02B 7/08; G02B 7/102; G02B 6/10; G02B 7/09;
(Continued)

(56) References Cited

U.S. PATENT DOCUMENTS

2006/0234557 A1 10/2006 Chen
2008/0045050 A1 2/2008 Shih
(Continued)

FOREIGN PATENT DOCUMENTS

CN 1696753 A 11/2005
CN 102016709 A 4/2011
(Continued)

OTHER PUBLICATIONS

European Search Report dated Jan. 25, 2023 in European Application No. 22203051.2.
(Continued)

*Primary Examiner* — Mustak Choudhury
(74) *Attorney, Agent, or Firm* — SALIWANCHIK, LLOYD & EISENSCHENK

(57) ABSTRACT

A lens moving apparatus is disclosed. The lens moving apparatus includes a bobbin equipped with at least one lens, a coil and a driving magnet arranged opposite to each other for moving the bobbin in an optical axis direction of the lens through interaction therebetween, a first circuit board for supplying electric current required by the coil, and a cover can and a base coupled to, contacted to, supported at, fixed to, or temporarily fixed to each other for forming a space in which the bobbin, the driving magnet, and the first circuit board are received, wherein the cover can is connected to a second circuit board having an image sensor mounted thereon.

20 Claims, 13 Drawing Sheets

Related U.S. Application Data continuation of application No. 14/821,066, filed on Aug. 7, 2015, now Pat. No. 10,295,782.

(51) Int. Cl.
*G02B 7/10* (2021.01)
*H05K 9/00* (2006.01)

(58) Field of Classification Search
CPC ...... G02B 7/023; G02B 7/282; H05K 9/0058; H05K 9/0075; H05K 9/0081; H05K 2201/09354; H04N 5/232; H04N 5/2257; H04N 5/23212; H04N 5/2354; G03B 17/00; G03B 7/16; G03B 13/34; G03B 15/05; G03B 3/02
See application file for complete search history.

(56) References Cited

U.S. PATENT DOCUMENTS

| | | | |
|---|---|---|---|
| 2009/0225452 A1* | 9/2009 | Wu | G02B 7/023 359/824 |
| 2009/0290233 A1 | 11/2009 | Chou | |
| 2010/0085474 A1 | 4/2010 | Morita | |
| 2011/0317988 A1 | 12/2011 | Lee | |
| 2013/0011224 A1 | 1/2013 | Hoyer et al. | |
| 2013/0136438 A1 | 5/2013 | Lee et al. | |
| 2013/0215284 A1 | 8/2013 | Wade et al. | |
| 2014/0043525 A1 | 2/2014 | Azuma et al. | |
| 2014/0063821 A1* | 3/2014 | Hegde | H04N 23/57 361/728 |
| 2014/0098434 A1 | 4/2014 | Baik et al. | |
| 2014/0327965 A1* | 11/2014 | Chen | H04N 23/687 359/557 |
| 2017/0235094 A1* | 8/2017 | Osaka | G02B 7/08 359/824 |

FOREIGN PATENT DOCUMENTS

| | | |
|---|---|---|
| CN | 102332805 A | 1/2012 |
| CN | 104730678 A | 6/2015 |
| JP | 2008-102537 A | 5/2008 |
| JP | 2012-027433 A | 2/2012 |
| JP | 2012-177753 A | 9/2012 |
| JP | 2013-038678 A | 2/2013 |
| JP | 2013-182138 A | 9/2013 |
| KR | 10-0880672 B1 | 2/2009 |
| KR | 10-2010-0103969 A | 9/2010 |
| KR | 10-1051509 B1 | 7/2011 |
| KR | 10-2013-0050767 A | 5/2013 |
| TW | 201205143 A1 | 2/2012 |
| WO | 2006/093934 A2 | 9/2006 |

OTHER PUBLICATIONS

European Search Report dated Dec. 11, 2015 in European Application No. 15179612.5.
Office Action dated Jan. 27, 2017 in U.S. Appl. No. 14/821,066.
Office Action dated Feb. 26, 2018 in U.S. Appl. No. 14/821,066.
Office Action dated Jul. 31, 2019 in Chinese Application No. 201510478704.4.
Office Action dated Feb. 25, 2020 in European Application No. 15 179 612.5.
Office Action dated May 14, 2020 in Chinese Application No. 201510478704.4.
Office Action dated Oct. 15, 2020 in Korean Application No. 10-2014-0110515.
Office Action dated Dec. 8, 2020 in Korean Application No. 10-2014-0101504.
Office Action dated Jan. 21, 2021 in U.S. Appl. No. 16/372,859.
Notice of Allowance dated Jan. 26, 2022 in U.S. Appl. No. 16/372,859.
Office Action dated Jul. 19, 2021 in U.S. Appl. No. 16/372,859.

* cited by examiner

LENS MOVING APPARATUS AND CAMERA MODULE INCLUDING THE SAME

CROSS REFERENCE TO RELATED APPLICATIONS

This application is a continuation of U.S. application Ser. No. 16/372,859, filed Apr. 2, 2019; which is a continuation of U.S. application Ser. No. 14/821,066, filed Aug. 7, 2015, now U.S. Pat. No. 10,295,782, issued May 21, 2019; which claims the benefit under 35 U.S.C. § 119 of Korean Patent Application Nos. 10-2014-0101504, filed Aug. 7, 2014 and 10-2014-0110515, filed Aug. 25, 2014; which are herein incorporated by reference in their entirety.

TECHNICAL FIELD

Embodiments relate to a lens moving apparatus and a camera module including the same.

BACKGROUND

In recent years, IT products equipped with digital cameras, such as mobile phones, smart phones, tablet PCs, and laptop computers, have been actively developed. It is required for a camera module having such a digital camera to provide various functions, such as auto focusing, handshake correction, and zooming. In addition, efforts are being made to miniaturize high-pixel camera modules.

Meanwhile, there is a high necessity for shielding electromagnetic interference (EMI), including electrical noise generated from components, such as a coil or a sensor, included in a conventional camera module.

In addition, the conventional camera module cannot recognize the position of a subject. As a result, the resolving power of an actuator may vary based on hysteresis or repeatability. Consequently, the conventional camera module may have a problem in that it takes a long time to perform an auto focusing function.

BRIEF SUMMARY

Embodiments provide a lens moving apparatus capable of shielding electromagnetic interference and a camera module including the same.

Further, embodiments provide a camera module capable of rapidly and accurately performing an auto focusing function.

In one embodiment, a lens moving apparatus includes a bobbin equipped with at least one lens, a coil and a driving magnet arranged opposite to each other for moving the bobbin in an optical axis direction of the lens through interaction therebetween, a first circuit board for supplying electric current required by the coil, and a cover can and a base coupled to, contacted to, supported at, fixed to, or temporarily fixed to each other for forming a space in which the bobbin, the driving magnet, and the first circuit board are received, wherein the cover can is connected to a second circuit board having an image sensor mounted thereon.

The first circuit board may include an electromagnetic interference (EMI) shielding terminal for connecting the cover can to the second circuit board.

The cover can may include at least one can protrusion protruding in a first direction parallel to the optical axis, the at least one can protrusion being connected to the second circuit board. The base may include a protruding recess, which the at least one can protrusion is mounted to, inserted in, seated at, contacted to, coupled to, fixed to, temporarily fixed to, supported at, or located at. The at least one can protrusion may be connected to the second circuit board by soldering, conductive epoxy, or welding.

The lens moving apparatus may further include a housing member coupled to, seated at, contacted to, fixed to, supported at, or located at the base for supporting the driving magnet and the first circuit board.

The first circuit board may be located under the housing member.

The lens moving apparatus may further include a displacement sensing unit for sensing a first displacement value of the bobbin in the optical axis direction, wherein the first circuit board may be mounted to, inserted in, seated at, contacted to, coupled to, fixed to, supported at, or located at an outer surface of one lateral surface of the housing member.

The housing member may have a sensor through hole formed at the one lateral surface thereof, which the first circuit board is mounted to, inserted in, seated at, contacted to, coupled to, fixed to, supported at, or located at, such that the displacement sensing unit is inserted in, located at, or seated at the sensor through hole.

The lens moving apparatus may further include a sensing magnet located at a position corresponding to the displacement sensing unit and the sensor through hole.

The EMI shielding terminal may be plated with gold.

The cover can may be made of a metal.

The first circuit board may further include an $I^2C$ communication terminal and a power terminal for receiving external power.

The cover can may be a yoke cover can.

In another embodiment, a lens moving apparatus includes a bobbin equipped with at least one lens, a coil and a driving magnet arranged opposite to each other for moving the bobbin in an optical axis direction of the at least one lens through interaction therebetween, a first circuit board for supplying electric current required by the coil, a cover can and a base coupled to each other for forming a space in which the bobbin, the driving magnet, and the first circuit board are received, and a cover covered by the cover can for fixing and supporting the bobbin, the driving magnet being coupled in the cover, wherein the cover is connected to a second circuit board having an image sensor mounted thereon.

The first circuit board may include an EMI shielding terminal for connecting the cover to the second circuit board.

The EMI shielding terminal may include an upper terminal portion connected to the cover can or the cover and a lower terminal portion connected to the second circuit board and the upper terminal portion. The EMI shielding terminal may further include a middle terminal portion located between the upper terminal portion and the lower terminal portion for interconnecting the upper terminal portion and the lower terminal portion.

The upper terminal portion may be connected to the cover can or the cover by soldering, conductive epoxy, or welding, and the lower terminal portion may be connected to the second circuit board by soldering, conductive epoxy, or welding.

In another embodiment, a camera module includes the image sensor, the second printed circuit board having the image sensor mounted thereon, and the lens moving apparatus with the above-stated construction.

In a further embodiment, a camera module includes a bobbin equipped with at least one lens, a position sensing unit for sensing the position of the bobbin in an optical axis direction and outputting the sensed position of the bobbin as position information, a first coil and a driving magnet arranged opposite to each other for moving the bobbin in an optical axis direction of the lens, and a focus controller for controlling interaction between the first coil and the driving magnet based on subject information and the position information to move the bobbin in a first direction parallel to the optical axis by a first movement amount, thereby performing an auto focusing function.

The subject information may include at least one selected from among the distance between a subject and the at least one lens, the position of the subject, and the phase of the subject.

The focus controller may include an information receiving unit for receiving the subject information, a bobbin position retrieval unit for retrieving the position of the bobbin having a proper focus corresponding to the received subject information, and a movement amount adjustment unit for moving the bobbin to the retrieved position by the first movement amount.

The bobbin position retrieval unit may include a lookup table for storing the position of the bobbin having a proper focus corresponding to the subject information in a mapped state and a data extraction unit for extracting the position of the bobbin having the proper focus corresponding to the received subject information from the lookup table The lookup table may code and store the position of the bobbin.

The lookup table may be created using the position sensing unit before the bobbin is moved by the first movement amount.

After moving the bobbin by the first movement amount, the focus controller may move the bobbin within a range of a second movement amount which is less than the first movement amount to find a final focal position of the bobbin having the largest modulation transfer function value.

The focus controller may move the bobbin for a predetermined period or a predetermined number of times so as to find the largest modulation transfer function value The camera module may further include a second coil located opposite to the driving magnet, and the bobbin may be moved in second and third directions perpendicular to the first direction by interaction between the second coil and the driving magnet.

The camera module may further include an image sensor for outputting the subject information to the focus controller.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
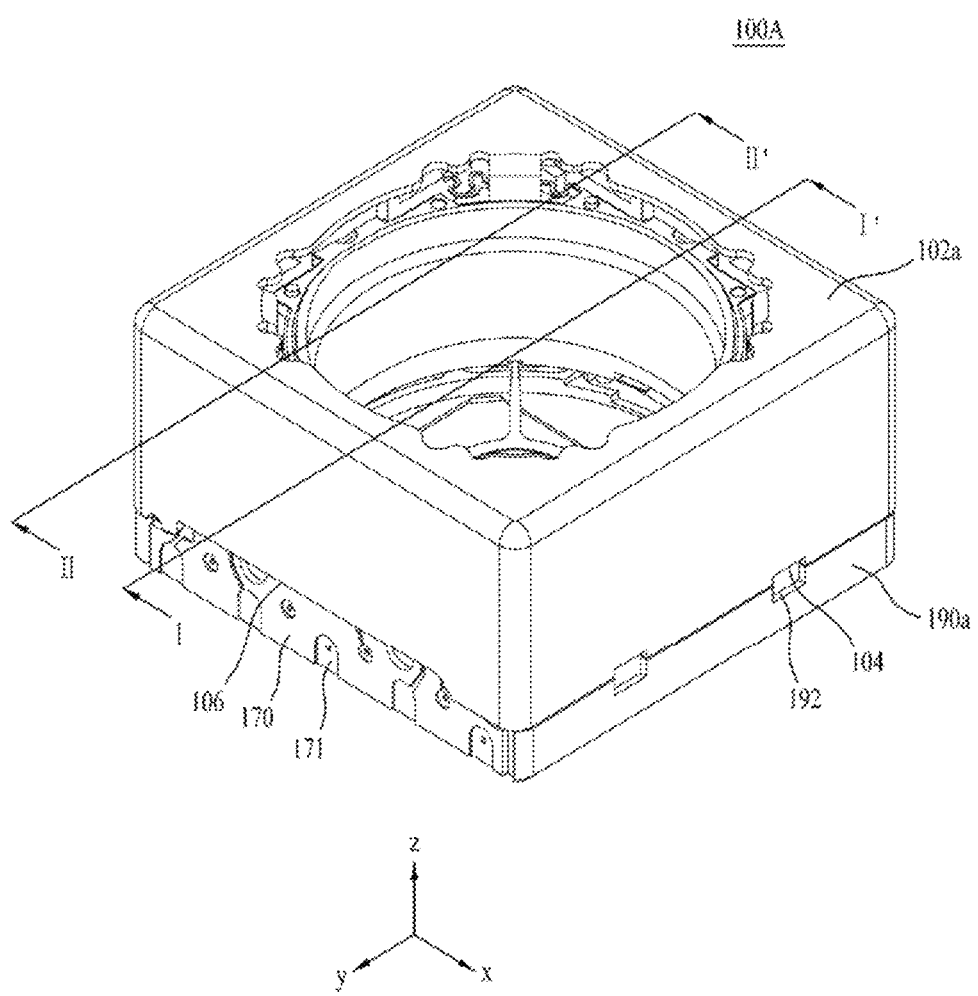
FIG. 1 is a perspective view schematically showing a lens moving apparatus according to an embodiment.

Now, embodiments will be described with reference to the annexed drawings to enable those skilled in the art to easily implement the embodiments. In the drawings, the same or similar elements are denoted by the same reference numerals even when they are depicted in different drawings. In addition, in the following description of the embodiments, a detailed description of known functions and configurations incorporated herein will be omitted when it may make the subject matter of the embodiments rather unclear. Some features of the drawings are enlarged, reduced, or simplified for convenience of description, and the drawings and components thereof are not necessarily shown at an appropriate ratio, which will be easily understood by those skilled in the art.

Hereinafter, embodiments shown in FIGS. 1 to 16 will be described using a Cartesian coordinate system (x, y, z). However, the disclosure is not limited thereto. That is, other different coordinate systems may be used. In the drawings, an x-axis direction and a y-axis direction are directions perpendicular to a z-axis direction, which is an optical axis direction. For the sake of convenience, the z-axis direction may be referred to as a first direction, the x-axis direction may be referred to as a second direction, and the y-axis direction may be referred to as a third direction.

Lens Moving Apparatus

A Lens Moving Apparatus According to an Embodiment

Figure 2:
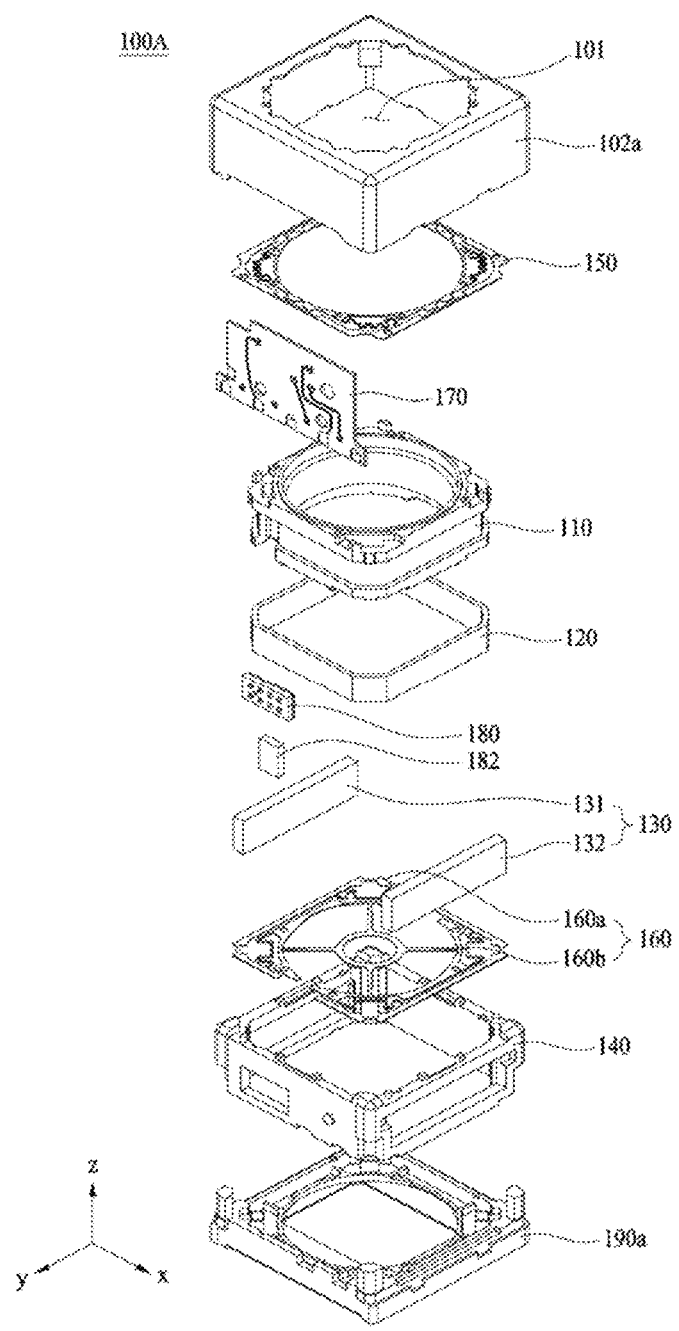
FIG. 2 is an exploded perspective view schematically showing an embodiment of the lens moving apparatus shown in FIG. 1.
Figure 3:
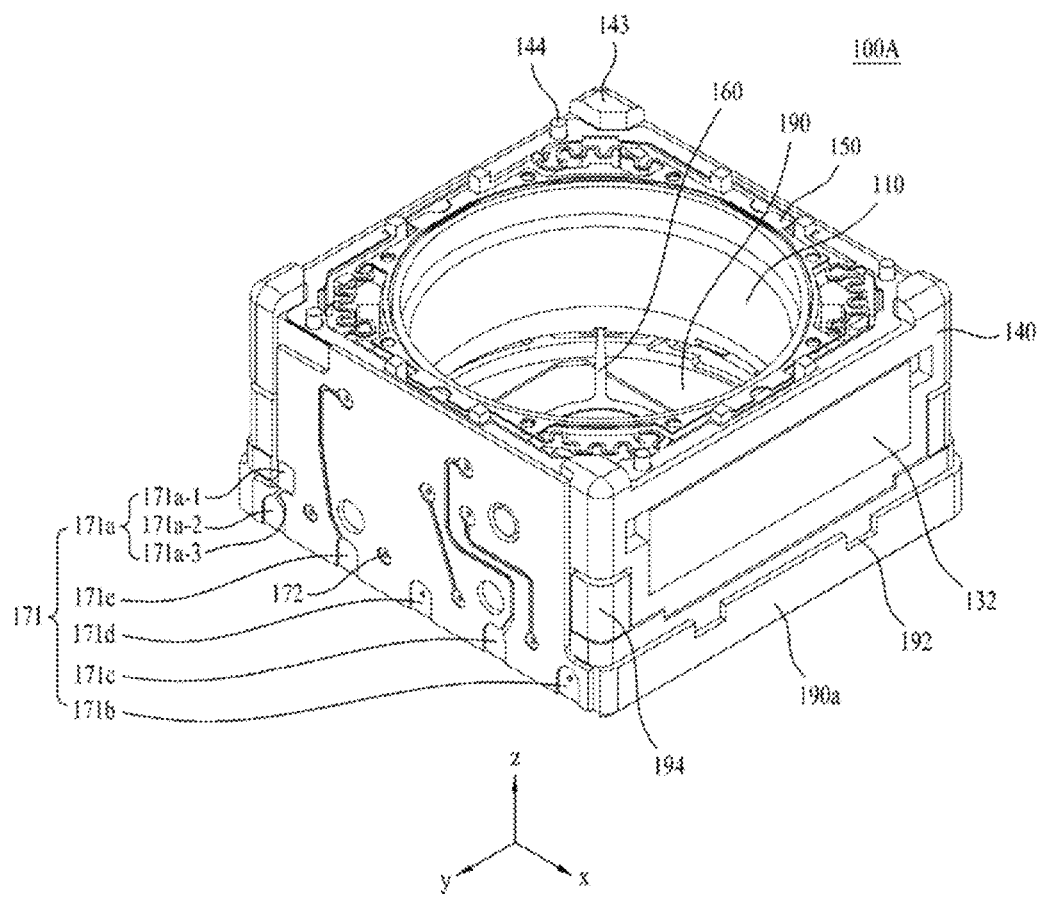
FIG. 3 is a perspective view schematically showing an embodiment of the lens moving apparatus with a cover can shown in FIG. 1 removed.

FIG. 1 is a perspective view schematically showing a lens moving apparatus 100A according to an embodiment, FIG. 2 is an exploded perspective view schematically showing an embodiment of the lens moving apparatus 100A shown in FIG. 1, and FIG. 3 is a perspective view schematically showing an embodiment of the lens moving apparatus 100A with a cover can 102a shown in FIG. 1 removed.

The lens moving apparatus 100A according to the embodiment is an apparatus for adjusting the distance between a lens (not shown) and an image sensor (not shown) of a camera module such that the image sensor is positioned at a focal distance of the lens. That is, the lens moving apparatus 100A is an apparatus that performs an auto focusing function.

As shown in FIGS. 1 to 3, the lens moving apparatus 100A according to the embodiment may include a cover can 102a, a bobbin 110, a first coil 120, a driving magnet 130, a housing member 140, an upper elastic member 150, a lower elastic member 160, a first circuit board 170, a displacement sensing unit (or a position sensing unit or displacement sensor) 180, a sensing magnet 182, and a base 190a.

The cover can 102a may be generally formed in the shape of a box. The cover can 102a may be mounted to, seated at, contacted to, fixed to, temporarily fixed to, supported at, coupled to, or located at an upper portion of the base 190a. The bobbin 110, the first coil 120, the driving magnet 130, the housing member 140, the upper elastic member 150, the lower elastic member 160, the first circuit board 170, the displacement sensing unit 180, and the sensing magnet 182 may be accommodated in a receiving space formed when the cover can 102a is mounted to, seated at, contacted to, fixed to, temporarily fixed to, supported at, coupled to, or located at the base 190a.

The cover can 102a may be provided at an upper surface thereof with an opening 101, through which a lens (not shown) coupled to the bobbin 110 is exposed to external light. In addition, a window made of a light-transmissive material may be provided in the opening 101 for inhibiting permeation of foreign matter, such as dust or moisture, into the camera module.

The cover can 102a may include a first recess 104 formed in a lower portion thereof, and the base 190a may include a second recess 192 formed in an upper portion thereof. When the cover can 102a is mounted to, seated at, contacted to, fixed to, temporarily fixed to, supported at, coupled to, or located at the base 190a, the second recess 192 may be formed in a portion of the base 190a that contacts the first recess 104 (i.e. a position of the base 190a corresponding to the first recess 104). A concave recess having a constant space may be formed through contact between, arrangement of, or coupling between the first recess 104 and the second recess 192, which will hereinafter be described. An adhesive, such as epoxy, having viscosity may be injected and applied into the concave recess. The adhesive applied into the concave recess may fill a gap between opposite surfaces of the cover can 102a and the base 190a to provided a seal between the cover can 102a and the base 190a in a state in which the cover can 102a is mounted to, seated at, contacted to, fixed to, temporarily fixed to, supported at, coupled to, or located at the base 190a. In addition, lateral surfaces of the cover can 102a and the base 190a may be sealed or coupled in a state in which the cover can 102a is mounted to, seated at, contacted to, fixed to, temporarily fixed to, supported at, coupled to, or located at the base 190a.

In addition, the cover can 102a may further include a third recess 106. The third recess 106 is formed at a surface of the cover can 102a corresponding to a terminal surface of the first circuit board 170 such that the cover can 102 does not interfere with a plurality of terminals 171 formed at the terminal surface of the first circuit board 170. The third recess 106 may be formed over the entire surface of the cover can 102a opposite to the terminal surface of the first circuit board 170 in a depressed state. An adhesive may be applied to the inside of the third recess 106 to seal or couple the cover can 102a, the base 190a, and the first circuit board 170.

The first recess 104 and the third recess 106 are formed in the cover can 102a, and the second recess 192 is formed in the base 190a. However, the disclosure is not limited thereto. That is, according to another embodiment, the first to third recesses 104, 192, and 106 may be formed only in the base 190a. Alternatively, the first to third recesses 104, 192, and 106 may be formed only in the cover can 102a.

In addition, the cover can 102a is made of a metal. However, the disclosure is not limited thereto. In addition, the cover can 102a may be made of a magnetic material.

The entire of the base 190a is formed in a quadrangular shape. The base 190a may include a stair protruding outward by a predetermined thickness for surrounding a lower edge of the base 190a. The stair may be formed in the shape of a continuous belt or an intermittent belt. The predetermined thickness of the stair may be equal to the lateral thickness of the cover can 102a. When the cover can 102a is mounted to, seated at, contacted to, fixed to, temporarily fixed to, supported at, coupled to, or located at the base 190a, the lateral surface of the cover can 102 may be mounted to, seated at, contacted to, coupled to, fixed to, supported at, or located at an upper portion or a lateral surface of the stair. Consequently, the cover can 102a coupled to the upper side of the stair may be guided by the stair. In addition, a distal end of the cover can 102a may be coupled to the stair in a surface contact fashion. The distal end of the cover can 102a may include a lower surface or a lateral surface. The stair and the distal end of the cover can 102a may be fixed by an adhesive, or may be coupled or sealed.

The second recess 192 may be formed at a position of the stair corresponding to the first recess 104 of the cover can 102a. As previously described, the second recess 192 may be coupled to the first recess 103 of the cover can 102a to form the concave recess, which is a space which is filled with an adhesive.

In the same manner as in the cover can 102a, the base 190a may include an opening formed around the center thereof. The opening may be formed at a position of the base 190a corresponding to the position of the image sensor provided in the camera module.

In addition, the base 190a may include four guide members 194 perpendicularly protruding upward from four corners thereof by a predetermined height. The guide members 194 may be formed in the shape of a polygonal prism. The guide members 194 may be may be mounted to, inserted in, seated at, contacted to, coupled to, fixed to, supported at, or located at lower guide recesses 148 of the housing member 140, which will hereinafter be described. When the housing member 140 is mounted to, seated at, contacted to, coupled to, fixed to, supported at, or located at the upper portion of the base 190a, the coupling position of the housing member 140 on the base 190a may be guided by the guide members 194 and the lower guide recesses 148 shown in FIG. 4, which will hereinafter be described. In addition, the coupling area between the housing member 140 and the base 190a may be increased. Furthermore, the housing member 140 is inhibited from deviating from a reference position, at which the housing member 140 is properly mounted, due to vibration during operation of the lens moving apparatus 100A or due to a worker's error during coupling of the lens moving apparatus 100A.

Figure 4:
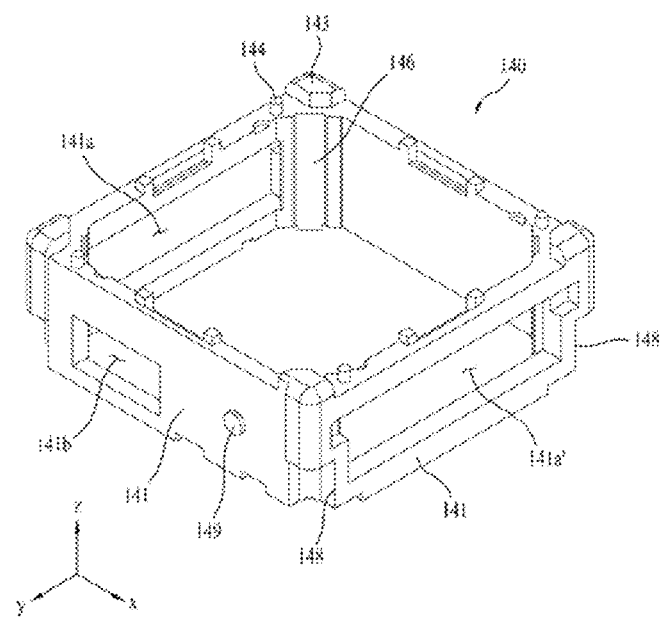
FIG. 4 is a plan perspective view schematically showing a housing member according to an embodiment.
Figure 5:
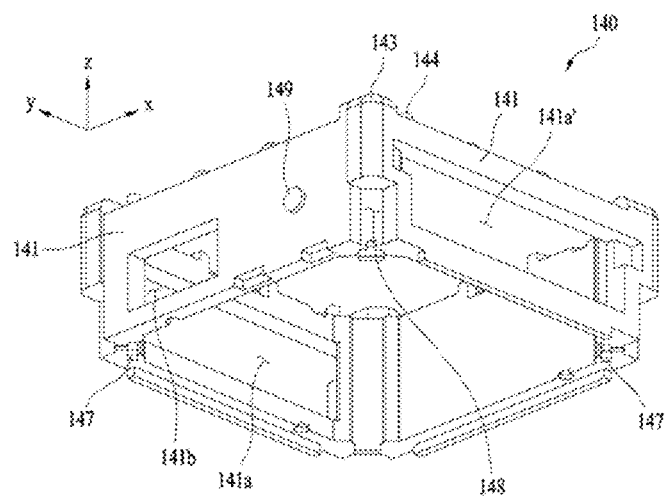
FIG. 5 is a bottom perspective view schematically showing the housing member according to the embodiment.
Figure 6:
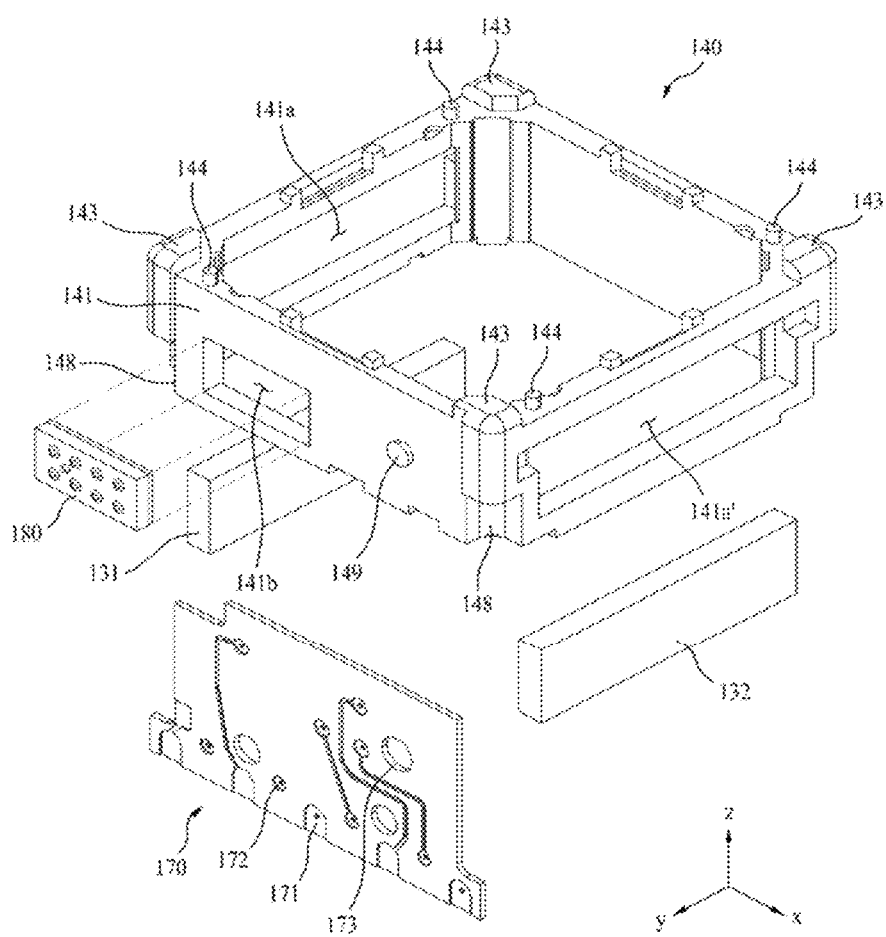
FIG. 6 is an exploded perspective view schematically showing a driving magnet, a housing member, a first circuit board, and a displacement sensing unit according to an embodiment.
Figure 7:
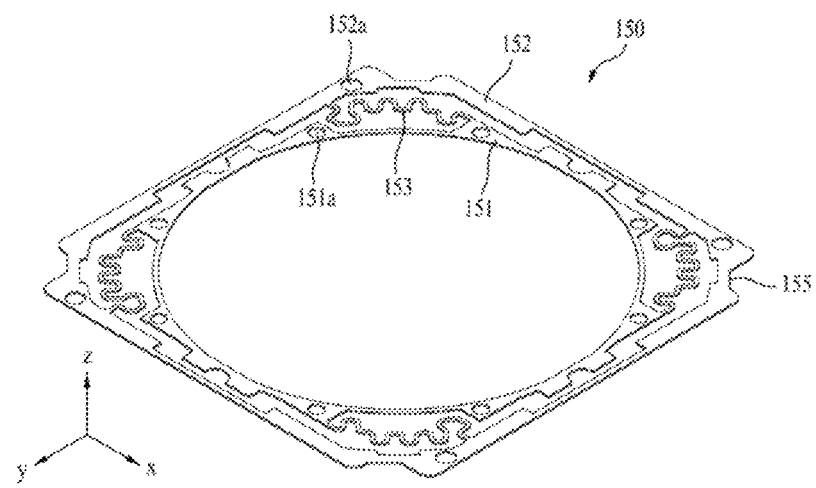
FIG. 7 is a plan perspective view showing an upper elastic member according to an embodiment.
Figure 8:
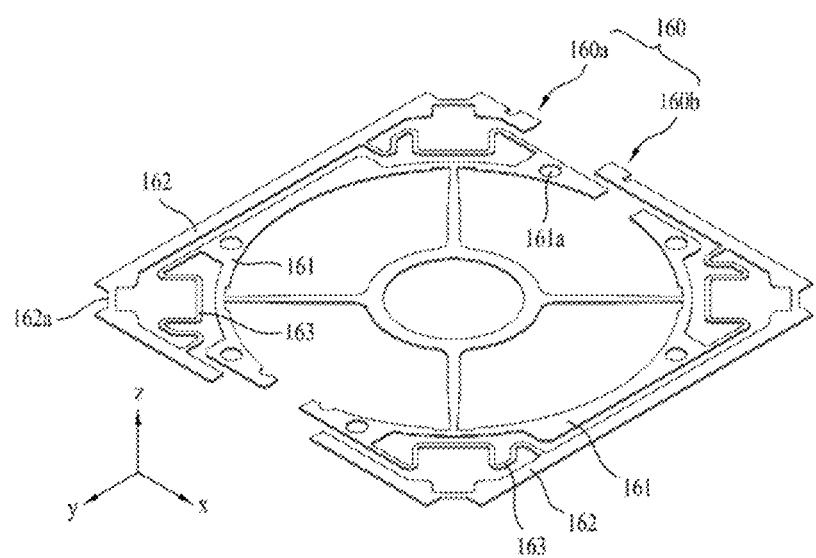
FIG. 8 is a plan perspective view showing a lower elastic member according to an embodiment.

FIG. 4 is a plan perspective view schematically showing a housing member 140 according to an embodiment, FIG. 5 is a bottom perspective view schematically showing the housing member 140 according to the embodiment, FIG. 6 is an exploded perspective view schematically showing a driving magnet 130, a housing member 140, a first circuit board 170, and a displacement sensing unit 180 according to an embodiment, FIG. 7 is a plan perspective view showing the upper elastic member 150, and FIG. 8 is a plan perspective view showing the lower elastic member 160.

Referring to FIGS. 4 to 6, the entire of the housing member 140 may be formed in the shape of a hollow-shaped prism (e.g. a hollow-shaped quadrangular prism as shown). The housing member 140 may have a shape for supporting at least two driving magnets 130 and the first circuit board 170. The bobbin 110 may be accommodated in the housing member 140 such that the bobbin 110 can move in a first direction, i.e. a z-axis direction, with respect to the housing member 140.

The housing member 140 may include four flat lateral surfaces 141. The lateral surfaces 141 of the housing member 140 may have an area equal to or greater than that of the driving magnet 130.

As shown in FIG. 6, first opposite lateral surfaces, selected from among the four lateral surfaces 141, of the housing member 140, may each be provided with a magnet through hole 141a (or recess), which the driving magnet 130 is mounted to, inserted in, seated at, contacted to, coupled to, fixed to, supported at, or located at. The magnet through hole 141a may have a size and/or shape corresponding to that of the driving magnet 130. In addition, the magnet through hole 141a may have a shape for being capable of guiding the driving magnet 130. One of the driving magnets 130 (hereinafter, referred to as a 'first driving magnet 131') and the other of the driving magnets 130 (hereinafter, referred to as a 'second driving magnet 132') may be mounted to, inserted in, seated at, contacted to, coupled to, fixed to, supported at, or located at the first and second magnet through holes 141a and 141a', respectively. In this embodiment, only two driving magnets 130 are shown. However, the disclosure is not limited thereto. That is, four driving magnets 130 may be arranged.

The driving magnet 130 may be classified as a ferrite magnet, an alnico magnet, or a rare-earth magnet. In addition, the driving magnet 130 may be classified as a P-type magnet or an F-type magnet. However, the disclosure is not limited thereto.

One lateral surface perpendicular to the first opposite lateral surfaces, selected from among the four lateral surfaces 141, of the housing member 140, or a lateral surface other than the first opposite lateral surfaces may be provided with a sensor through hole (or positioning through hole) 141b or a recess (not shown), which the displacement sensing unit 180, which will hereinafter be described, is mounted to, inserted in, seated at, contacted to, coupled to, fixed to, supported at, or located at. The sensor through hole 141b may have a size and shape corresponding to those of the displacement sensing unit 180, which will hereinafter be described. The sensor through hole 141b may be spaced apart from the first and second magnet through holes 141a and 141a' by a predetermined distance. The sensor through hole 141b may be formed at the lateral surface, selected from among the four lateral surfaces 141, of the housing member 140 which the first circuit board 170 is mounted to, seated at, contacted to, fixed to, temporarily fixed to, supported at, coupled to, or located at.

In addition, one lateral surface of the housing member 140 may be provided with at least one mounting protrusion 149, through which the first circuit board 170 is mounted to, seated at, contacted to, coupled to, fixed to, temporarily fixed to, supported at, or located at the housing member 140.

The mounting protrusion 149 may be mounted to, inserted in, seated at, contacted to, coupled to, fixed to, temporarily fixed to, supported at, or located at a mounting through hole 173 formed in the first circuit board 170. The mounting through hole 173 and the mounting protrusion 149 may be contacted to or coupled to each other in a shape fitting fashion or in a force-fitting fashion. The mounting through hole 173 and the mounting protrusion 149 may simply guide the first circuit board 170 and the housing member 140 such that the first circuit board 170 is mounted to, seated at, contacted to, coupled to, fixed to, temporarily fixed to, supported at, or located at the housing member 140.

The other lateral surface opposite to one lateral surface, selected from among the four lateral surfaces 141, of the housing member 140 may be flat. However, the disclosure is not limited thereto.

Although not shown, third and fourth magnet through holes may be further provided at second opposite lateral surfaces perpendicular to the first opposite lateral surfaces of the housing member 140.

The first magnet through hole 141a and the second magnet through hole 141a' may have the same size and the same shape. In addition, the first magnet through hole 141a and the second magnet through hole 141a' may have almost the same lateral length in a lateral direction of the first opposite lateral surfaces of the housing member 140. On the other hand, the third magnet through hole and the fourth magnet through hole may have the same size and the same shape, whereas the third magnet through hole and the fourth magnet through hole may have a shorter lateral length than the first magnet through hole 141a and the second magnet through hole 141a'. This is because it is necessary to secure a space for the sensor through hole 141b since the sensor through hole 141b is formed in one of the second opposite lateral surfaces, in which the third or fourth magnet through hole is formed.

As previously described, the first driving magnet 131 and the second driving magnet 132 may have the same size and the same shape. In addition, the first driving magnet 131 and the second driving magnet 132 may have almost the same lateral length in the lateral direction of the first opposite lateral surfaces of the housing member 140. The third and fourth driving magnets (not shown), which are mounted to, inserted in, seated at, contacted to, coupled to, fixed to, temporarily fixed to, supported at, or located at the third and fourth magnet through holes (not shown), respectively, may have the same size and the same shape. In addition, the third and fourth driving magnets may have a shorter lateral length than the first driving magnet 131 and the second driving magnet 132.

In the same manner as in the first and second magnet through holes 141a and 141a', the third and fourth magnet through holes may be arranged in line symmetrically with respect to the center of the housing member 140. That is, the third and fourth driving magnets (not shown) may be arranged on the basis of the center of the housing member 140, or in line symmetrically with respect to the center of the housing member 140.

If the first and second driving magnets 131 and 132 or the third and fourth driving magnets are opposite to each other in a state of deviating to one side of the housing member 140 regardless of the center of the housing member 140, electromagnetic force is applied to one side of the first coil 120 of the bobbin 110 in a state of deviation, whereby the bobbin 110 may tilt. In other words, in a case in which the third and fourth driving magnets are arranged in line symmetrically with respect to the center of the housing member 140 in the same manner as in the first and second driving magnets 131 and 132, undeviating electromagnetic force may be applied to the first coil 120 and the bobbin 110, whereby it is possible to easily and accurately guide first-direction movement of the bobbin 110.

Hereinafter, it is assumed that the lens moving apparatus 100A according to the embodiment includes only the first and second driving magnets 131 and 132 for the convenience of description. However, the following description may equally be applied to a case in which the third and fourth driving magnets are further included in the lens moving apparatus 100A.

A plurality of first stoppers 143 may be formed at an upper surface of the housing member 140 in a protruding state. The first stoppers 143 are provided to inhibit collision between the cover can 102a and a body of the housing member 140. When external impact occurs, the first stoppers 143 may inhibit the upper surface of the housing member 140 from directly colliding with an inner surface of the upper portion of the cover can 102a. In addition, the first stoppers 143 may also function to guide an installation position of the upper elastic member 150. For example, referring to FIGS. 3 and 7, the upper elastic member 150 may be provided at positions thereof corresponding to the first stoppers 143 with guide recesses 155 having shapes corresponding to the first stoppers 143.

In addition, a plurality of upper frame supporting protrusions 144, which an outer frame 152 of the upper elastic member 150 is inserted in, seated at, contacted to, fixed to, temporarily fixed to, coupled to, supported at, or located at, may be formed at the upper side of the housing member 140 in a protruding state. First through holes (or recesses) 152a having shapes corresponding to the upper frame supporting protrusions 144 may be formed at the outer frame 152 of the upper elastic member 150. After the upper frame supporting protrusions 144 are inserted in, seated at, contacted to, fixed to, temporarily fixed to, coupled to, supported at, or located at the first through holes 152a, the upper frame supporting protrusions 144 may be fixed using an adhesive or by fusion. The fusion may include thermal fusion or ultrasonic fusion.

In addition, a plurality of lower frame supporting protrusions 147, to which an outer frame 162 of the lower elastic member 160 is coupled, may be formed at the lower side of the housing member 140 in a protruding state. The lower frame supporting protrusions 147 may be formed at four respective corners of the lower side of the housing member 140. Meanwhile, referring to FIG. 8, coupling parts 162a, which may be mounted to, inserted in, seated at, contacted to, coupled to, fixed to, temporarily fixed to, supported at, or located at the lower frame supporting protrusions 147, may be formed at positions of the outer frame 162 of the lower elastic member 160 corresponding to the lower frame supporting protrusions 147. The coupling parts 162a may be fixed using an adhesive or by fusion. The fusion may include thermal fusion or ultrasonic fusion.

In addition, the housing member 140 may be a yoke housing member having a yoke function. The yoke housing member may be configured to have a structure in which the upper elastic member 150 is spaced apart from an inner surface of an upper surface of a yoke such that the bobbin 110 moves upward without interference with the yoke.

Alternatively, the yoke (not shown) may have in itself a function as the housing member 140. In this case, the yoke may be coupled to the base 190a, and the upper elastic member 150 may be located at a lower portion of the yoke or in the yoke.

In another embodiment, an additional cover may be further located at an upper portion of the yoke. In this case, the upper elastic member 150 may be located at the upper portion of the yoke or between the yoke and the cover. In addition, the upper elastic member 150 may be coupled to the cover or the yoke.

Meanwhile, the driving magnets 130 (131 and 132) may be fixed to the magnet through holes 141a and 141a' using an adhesive. However, the disclosure is not limited thereto. An adhesive member, such as a double-sided tape, may be used. In a modification, concave recess-shaped magnet seating parts (not shown) may be formed in the inner surface of the housing member 140 instead of the first and second magnet through holes 141a and 141a' unlike what is shown. The magnet seating parts may have a size and shape corresponding to those of the driving magnets 130.

The driving magnets 130 may be installed at positions facing the first coil 120 located at an outer circumferential surface of the bobbin 110. In addition, the driving magnets 130 may be separately configured as shown. Alternatively, the driving magnets 130 may be integrated unlike what is shown. In an embodiment, the driving magnets 130 may be arranged such that inside surface of each of the driving magnets 130 facing the first coil 120 of the bobbin 110 has an N pole, and outside surface of each of the driving magnets 130 has an S pole. However, the disclosure is not limited thereto. The driving magnets 130 may be arranged such that the inside surface of each of the driving magnets 130 facing the first coil 120 of the bobbin 110 has an S pole, and the outside surface of each of the driving magnets 130 has an N pole.

In addition, the driving magnet 130 may be divided into two parts on a plane perpendicular to an optical axis. That is, the driving magnet 130 may be bipolar-magnetized magnets, which include a first magnet (not shown) and a second magnet (not shown) opposite to each other on the plane perpendicular to the optical axis in a state in which a non-magnetic partition is disposed therebetween. The non-magnetic partition may be air or a non-magnetic material. The first and second magnets may be arranged so as to have opposite polarities. However, the disclosure is not limited thereto. The first and second magnets may have various forms.

The first and second driving magnets 131 and 132 may be configured to have a rectangular hexahedral shape having a predetermined width. The first and second driving magnets 131 and 132 may be seated in the first and second magnet through holes 141a and 141a', respectively, such that large surfaces or partial surfaces of the first and second driving magnets 131 and 132 form a portion of the lateral surface (the outer surface or the inner surface) of the housing member 140. In addition, the first and second driving magnets 131 and 132 may be located at the lateral surface of the housing member 140, and at the same time may be located at or coupled to the inner surface of the aforementioned yoke. Alternatively, the first and second driving magnets 131 and 132 may be coupled to or fixed to the inner surface of the yoke without the housing member 140. At this time, the first and second driving magnets 131 and 132, which face each other, may be installed in parallel to each other. In addition, the surfaces of each of the driving magnets 130 and the first coil 120 of the bobbin 110, which face each other, may be flat such that the faced surfaces thereof are parallel to each other. However, the disclosure is not limited thereto. One of the surfaces of the driving magnets 130 and the first coil 120 of the bobbin 110 may be flat, and the other of the surfaces of the driving magnets 130 and the first coil 120 of the bobbin 110 may be curved. Alternatively, both the surfaces of the driving magnets 130 and the first coil 120 of the bobbin 110, which face each other, may be curved. In this case, the surfaces of the driving magnets 130 and the first coil 120 of the bobbin 110, which face each other, may have the same curvature.

In addition, as previously described, the sensor through hole 141b or the recess may be provided in one lateral surface of the housing member 140, and the displacement sensing unit 180 may be mounted to, inserted in, seated at, contacted to, coupled to, fixed to, temporarily fixed to, supported at, or located at the sensor through hole 141b or the recess. The displacement sensing unit 180 may electrically be connected to one surface of the first circuit board 170 by soldering. In other words, the first circuit board 170 may be mounted to, inserted in, seated at, contacted to, coupled to, fixed to, temporarily fixed to, supported at, or located at an outer surface of one lateral surface, at which the sensor through hole 141b or the recess is provided, selected from among the four lateral surfaces 141, of the housing member 140.

The displacement sensing unit 180 may sense/determine a first displacement value of the bobbin 110 in a first direction together with the sensing magnet 182, which will hereinafter be described. The first displacement value in the first direction may mean the position of the bobbin 110 in the first direction. To this end, the displacement sensing unit 180 and the sensor through hole 141b or the recess may be located at positions corresponding to the sensing magnet 182. Unlike what is shown, the sensing magnet 182 may be divided into an upper part and a lower part so as to increase the intensity of a magnetic field. However, the disclosure is not limited thereto.

The displacement sensing unit 180 may be a sensor for sensing the change in magnetic force emitted from the sensing magnet 182 of the bobbin 110. For example, the displacement sensing unit 180 may be a Hall sensor. However, the disclosure is not limited thereto. In another embodiment, any sensor capable of sensing the change in magnetic force as well as the Hall sensor may be used as the displacement sensing unit 180. Alternatively, any sensor for sensing a position besides the magnetic force may be used as the displacement sensing unit 180. For example, a photo reflector may be used. In a case in which the displacement sensing unit 180 is embodied by the Hall sensor, calibration for an actuator driving distance may be further executed based on a Hall voltage difference according to the change in magnet flux sensed by the Hall sensor. For example, in a case in which the displacement sensing unit 180 is embodied by the Hall sensor, the Hall sensor may have a plurality of pins. For example, the pins may include first and second pins. The first pin may include 1-1 and 1-2 pins connected to voltage and ground, respectively. The second pin may include 2-1 and 2-2 pins for outputting sensed results. The sensed results output through the 2-1 and 2-2 pins may be current. However, the disclosure is not limited thereto. The first circuit board 170 is connected to the Hall sensor 180 to supply power to the 1-1 and 1-2 pins and to receive signals from the 2-1 and 2-2 pins.

The first circuit board 170 may be mounted to, inserted in, seated at, contacted to, coupled to, fixed to, temporarily fixed to, supported at, or located at one lateral surface of the housing member 140. At this time, the installation position of the first circuit board 170 may be guided by the mounting protrusion 149 formed at one lateral surface of the housing member 140 as previously described. One mounting protrusion 149 may be formed. Alternatively, a plurality of mounting protrusions 149 may be formed. In a case in which two or more mounting protrusions 149 are formed, it is possible to more easily guide the installation position of the first circuit board 170.

A plurality of terminals 171 may be located at the first circuit board 170 for receiving external power and supplying currents required for the first coil 120 of the bobbin 110 and the displacement sensing unit 180. The number of terminals 171 formed at the first circuit board 170 may be adjusted based on kind of components to be controlled. For example, the terminals 171 of the first circuit board 170 may include power terminals 171b and 171c for receiving external power and $I^2C$ communication terminals 171d and 171e. The power terminal 171b may be a terminal connected to supply voltage, and the power terminal 171c may be a terminal connected to ground.

In addition, referring to FIGS. 3 and 6, the first circuit board 170 may be provided with at least one pin 171. Although four pins 172 are provided as shown, the number of pins 172 may be greater or less than 4. For example, the four pins 171 may be a test pin, a hole pin, a VCM+ pin, and a VCM− pin. However, the disclosure is not limited thereto. The test pin may be used to evaluate the performance of lens moving apparatus 100A. The hole pin may be used to extract data output from the displacement sensor 180. The VCM+ pin and the VCM− pin may be used to evaluate the performance of the lens moving apparatus 100A without feedback from the displacement sensor 180.

In an embodiment, the first circuit board 170 may be a flexible printed circuit board (FPCB). The first circuit board 170 may include a controller (not shown) for readjusting the amount of electric current applied to the first coil 120 based on a first displacement value sensed by the displacement sensing unit 180. For example, the controller may receive signals from the 2-1 and 2-2 pins of the Hall sensor 180. The controller may be mounted on the first circuit board 170. In another embodiment, the controller may not be mounted on the first circuit board 170 but may be mounted on an additional circuit board. The additional circuit board may be a second circuit board (not shown), on which an image sensor (not shown) is mounted in the camera module, or another circuit board.

In the above-described example, the lens moving apparatus 100A includes the displacement sensing unit 180. According to circumstances, however, the displacement sensing unit 180 may be omitted.

In addition, in the above-described example, the first circuit board 170 is mounted to, inserted in, seated at, contacted to, coupled to, fixed to, temporarily fixed to, supported at, or located at the outer surface of the housing member 140. However, the disclosure is not limited thereto. That is, in another embodiment, in a case in which the lens moving apparatus 100A does not include the displacement sensing unit 180, the first circuit board 170 may be located under the housing member 140 instead of the outer surface of the housing member 140.

Meanwhile, in order to shield electromagnetic interference (EMI), the cover can 102a may be electrically connected to the second circuit board, on which the image sensor is mounted. EMI may include electromagnetic noise which may be generated in the first coil 120 or the Hall sensor embodying the displacement sensing unit 180. The respective components of the lens moving apparatus 100A may malfunction or may be damaged due to EMI. In order to shield EMI, therefore, the cover can 102a may be electrically connected to the second circuit board. In a case in which the cover can 102a is electrically connected to the second circuit board, the cover can 102a and the second circuit board are grounded, whereby EMI is shielded.

In an embodiment, the cover can 102a may be a yoke cover can having a yoke function. In addition, the cover can 102a may be made of a SUS material, a magnetic material, or a metallic material. However, the disclosure is not limited thereto. The cover can 102a may be made of any material exhibiting electrical conductivity.

In another embodiment, the lens moving apparatus 100A may further include a cover (not shown). The cover may be covered by the cover can 102a, and may fix and support the bobbin 110. The driving magnet 130 may be mounted to, inserted in, seated at, contacted to, coupled to, fixed to, temporarily fixed to, supported at, or located at the inside of the cover. In this case, the cover may be electrically connected to the second circuit board instead of the cover can 102a or together with the cover can 102a to shield EMI.

In addition, in an embodiment, the cover can 102a or the cover may be electrically connected to the second circuit board using the first circuit board 170. To this end, the terminals 171 of the first circuit board 170 may further include an EMI shielding terminal 171a as shown in FIG. 3. The EMI shielding terminal 171a electrically connects the cover can 102a to the second circuit board.

Figure 9:
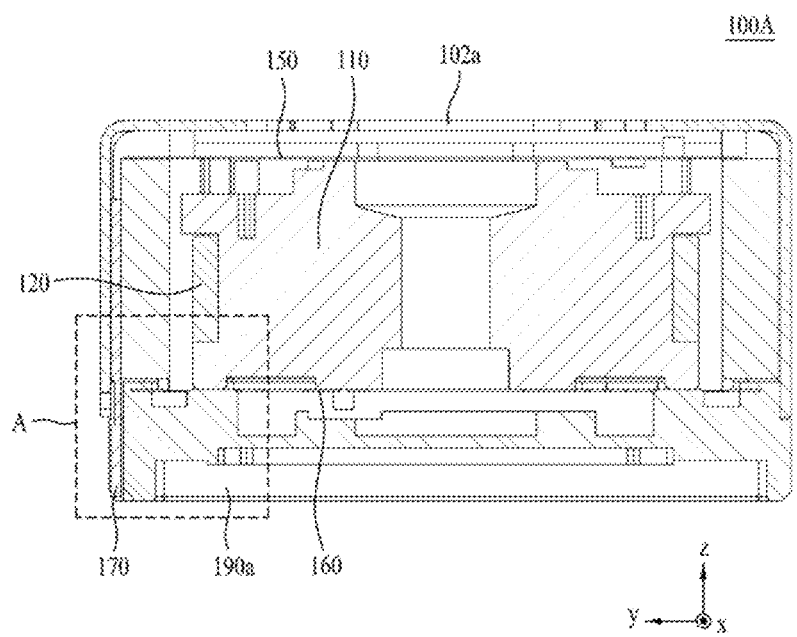
FIG. 9 is a sectional view taken along line I-I' of FIG. 1 when viewed in a positive x-axis direction.
Figure 10:
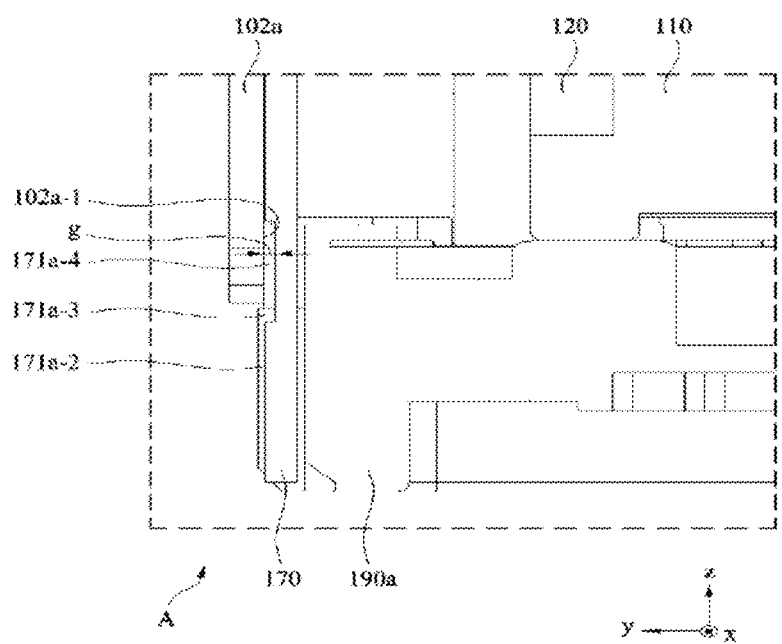
FIG. 10 is an enlarged sectional view showing a portion 'A' of FIG. 9.
Figure 11:
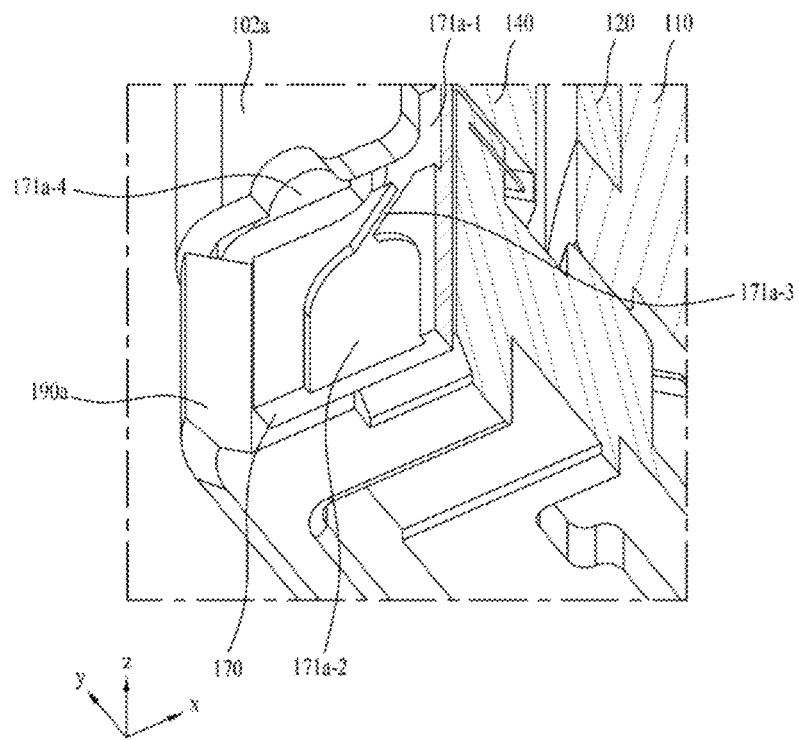
FIG. 11 is a perspective view showing a portion of the lower left part of the lens moving apparatus when taken along line II-II' of FIG. 1.

FIG. 9 is a sectional view taken along line I-I' of FIG. 1 when viewed in a positive (+) x-axis direction, FIG. 10 is an enlarged sectional view showing a portion 'A' of FIG. 9, and FIG. 11 is a perspective view showing a portion of the lower left part of the lens moving apparatus when taken along line II-II' of FIG. 1. Reference symbol 171a-4 indicates a body of the first circuit board 170.

Referring to FIGS. 9 to 11, the EMI shielding terminal 171a may include an upper terminal portion 171a-1 and a lower terminal portion 171a-2. The upper terminal portion 171a-1 may electrically be connected to the cover can 102a or the cover (not shown). For example, referring to FIG. 10, an inner surface 102a-1 of the cover can 102a or an inner surface of the cover (not shown) may electrically be connected to an outer surface of the upper terminal portion 171a-1 by soldering, conductive epoxy, or welding. For example, referring to FIG. 10, a distance g between the inner surface 102a-1 of the cover can 102a and the outer surface of the upper terminal portion 171a-1 may be 0.15 mm or less such that soldering is easily carried out. However, the disclosure is not limited thereto.

The lower terminal portion 171a-2 may electrically be connected to the second circuit board and the upper terminal portion 171a-1. At this time, the lower terminal portion 171a-2 may electrically be connected to the second circuit board by soldering, conductive epoxy, or welding.

In addition, in an embodiment, the EMI shielding terminal 171a may further include a middle terminal portion 171a-3. The middle terminal portion 171a-3 is located between the upper terminal portion 171a-1 and the lower terminal portion 171a-2 for electrically interconnecting the upper terminal portion 171a-1 and the lower terminal portion 171a-2. Although the upper, middle, and lower terminal portions 171a-1, 171a-2, and 171a-3 are integrated as shown, the upper, middle, and lower terminal portions 171a-1, 171a-2, and 171a-3 may be separately formed.

For example, the EMI shielding terminal 171a may be plated with gold such that the EMI shielding terminal 171a is electrically and effectively connected to the second circuit board. However, the disclosure is not limited thereto.

A Lens Moving Apparatus According to Another Embodiment

Figure 12:
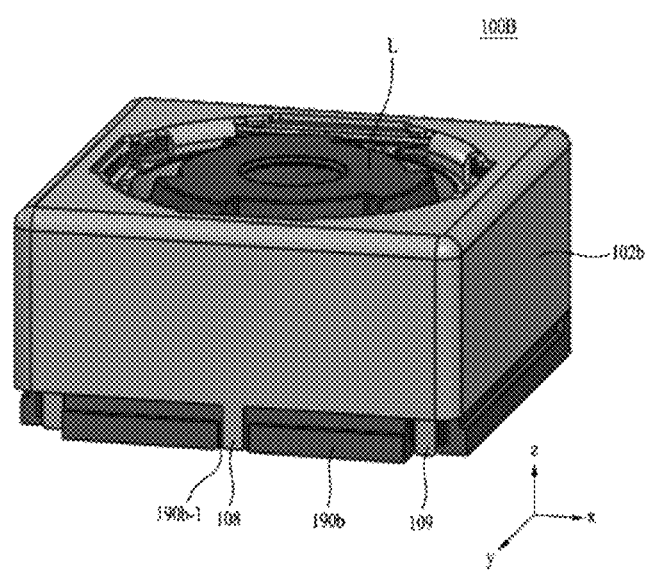
FIG. 12 is a perspective view schematically showing a lens moving apparatus equipped with a lens according to another embodiment.

FIG. 12 is a perspective view schematically showing a lens moving apparatus 100B equipped with a lens L according to another embodiment.

The lens moving apparatus 100B shown in FIG. 12 is different from the lens moving apparatus 100A shown in FIG. 1 in terms of external appearance of a cover can 102b and a base 190b. The displacement sensing unit 180 is included in the lens moving apparatus 100A shown in FIG. 1, whereas the displacement sensing unit 180 is not included in the lens moving apparatus 100B shown in FIG. 12. Except such differences, lens moving apparatus 100B shown in FIG. 12 may be identical in internal construction to the lens moving apparatus 100A shown in FIGS. 1 to 11. A VCM terminal 109 shown in FIG. 12 may correspond to the terminal for supplying electric current to the first coil 120 in the lens moving apparatus 100A shown in FIG. 1.

Hereinafter, the lens moving apparatus 100B shown in FIG. 12 will be described based on differences between the lens moving apparatus 100B shown in FIG. 12 and the lens moving apparatus 100A shown in FIGS. 1 to 11 for the convenience of description. However, the disclosure is not limited thereto.

In another embodiment, the cover can 102a and the second circuit board may electrically be connected to each other without using the EMI shielding terminal 171a of the first circuit board 170. To this end, as shown in FIG. 12, the cover can 102b may include at least one can protrusion 108, and the base 190b may include a protruding recess 190b-1. The at least one can protrusion 108 may protrude in a first direction (i.e. a −z direction) parallel to an optical axis such that the at least one can protrusion 108 is electrically connected to the second circuit board. As shown in FIG. 12, one can protrusion 108 may be disposed at each lateral surface of the lens moving apparatus 100B so that a plurality of can protrusions 108 is provided. However, the disclosure is not limited thereto. Although not shown, the at least one can protrusion 108 may electrically be connected to the second circuit board by soldering, conductive epoxy, or welding.

The can protrusion 108 may be inserted in, penetrated through, located in, or fitted in the protruding recess 190b-1 formed at the base 190b.

In a further embodiment, the cover can 102a or 102b or the cover (not shown) may electrically be connected to the second circuit board through the first circuit board 170 as shown in FIGS. 1 to 11, and may electrically be connected to the second circuit board through the can protrusion 108 as shown in FIG. 12.

Figure 13:
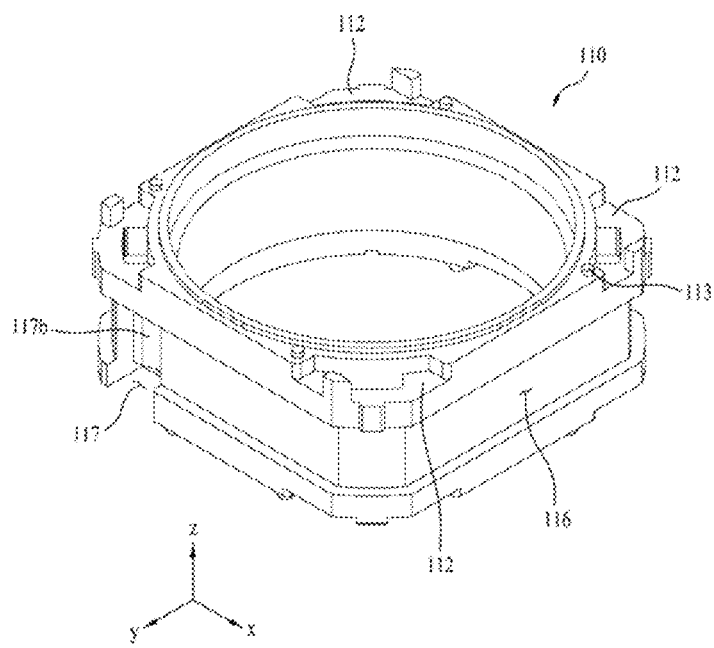
FIG. 13 is a plan perspective view showing an embodiment of a bobbin shown in FIG. 2.
Figure 14:
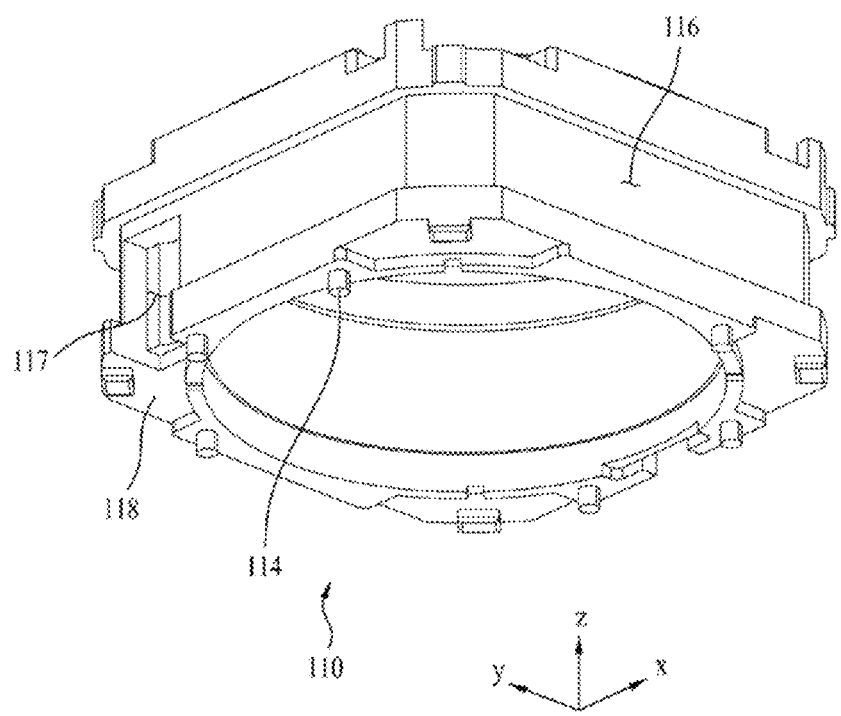
FIG. 14 is a bottom perspective view showing the embodiment of the bobbin shown in FIG. 2.

FIG. 13 is a plan perspective view showing an embodiment of the bobbin 110 shown in FIG. 2, and FIG. 14 is a bottom perspective view showing the embodiment of the bobbin 110 shown in FIG. 2.

Referring to FIGS. 4, 5, 7, 8, 13, and 14, the upper elastic member 150 and the lower elastic member 160 may elastically support upward and/or downward movement of the bobbin 110. The upper elastic member 150 and the lower elastic member 160 may each be a leaf spring. However, the disclosure is not limited thereto.

The upper elastic member 150 may include an inner frame 151 coupled to the bobbin 110, an outer frame 152 coupled to the housing member 140, and a connection part 153 connecting the inner frame 151 with the outer frame 152.

In addition, the lower elastic member 160 may include an inner frame 161 coupled to the bobbin 110, an outer frame 162 coupled to the housing member 140, and a connection part 163 connecting the inner frame 161 with the outer frame 162.

The connection parts 153 and 163 may be bent at least once to form a predetermined pattern. The upward and/or downward movement of the bobbin 110 in the optical axis direction, i.e. the first direction, may be flexibly (or elastically) supported through the chance in position and micro deformation of the connection parts 153 and 163.

In an embodiment, as shown in FIG. 7, the upper elastic member 150 may include a plurality of first through holes 152a formed at the outer frame 152 and a plurality of second through holes 151a formed at the inner frame 151.

The first through holes 152a may be coupled to upper frame supporting protrusions 144 formed at the upper surface of the housing member 140, and the second through holes 151a may be coupled to the upper supporting protrusions 113 formed at the upper surface of the bobbin 110. The upper supporting protrusions 113 will hereinafter be described in detail. That is, the outer frame 152 may be mounted to, seated at, contacted to, fixed to, temporarily fixed to, supported at, located at, or coupled to the housing member 140 through the first through holes 152a, and the inner frame 151 may be mounted to, seated at, contacted to, fixed to, temporarily fixed to, supported at, located at, or coupled to the bobbin 110 through the second through holes 151a.

The connection part 153 of the upper elastic member 150 may be connected between the inner frame 151 and the outer frame 152 such that the inner frame 151 can be elastically deformed with respect to the outer frame 152 within a predetermined range in the first direction.

At least one selected from between the inner frame 151 the outer frame 152 of the upper elastic member 150 may include at least one a terminal portion electrically connected to at least one selected from between the first coil 120 of the bobbin 110 and the first circuit board 170.

Referring to FIG. 8, the lower elastic member 160 may include a plurality of coupling parts 162a formed at the outer frame 162 and a plurality of third through holes (or recesses) 161a formed at the inner frame 161.

As previously described, the coupling parts 162a may be mounted to, inserted in, seated at, contacted to, coupled to, fixed to, temporarily fixed to, supported at, or located at a lower surface of the housing member 140, and the third through holes 161a may be contacted to, coupled to, fixed to, and temporarily fixed to lower supporting protrusions 114 formed at a lower surface of the bobbin 110 shown in FIG. 14. That is, the outer frame 162 may be mounted to, inserted in, seated at, contacted to, coupled to, fixed to, temporarily fixed to, supported at, or located at the housing member 140 through the coupling parts 162a, and the inner frame 161 may be mounted to, inserted in, seated at, contacted to, coupled to, fixed to, temporarily fixed to, supported at, or located at the bobbin 110 through the third through holes 161a.

The connection part 163 of the lower elastic member 160 may be connected between the inner frame 161 and the outer frame 162 such that the inner frame 161 can be elastically deformed with respect to the outer frame 162 within a predetermined range in the first direction.

The lower elastic member 160 may include a first lower elastic member 160a and a second lower elastic member 160b, which are separated from each other. In such a two-division structure, powers having different polarities or different electric currents may be supplied to the first lower elastic member 160a and the second lower elastic member 160b of the lower elastic member 160. That is, after the inner frame 161 and the outer frame 162 are coupled to the bobbin 110 and the housing member 140, respectively, powers having different polarities or different electric currents may be supplied to the first lower elastic member 160a and the second lower elastic member 160b through conductive connection, such as connection by soldering, of solder portions provided at positions of the inner frame 161 corresponding to both ends of the first coil 120 located at the bobbin 110. In addition, the first lower elastic member 160a may electrically be connected to one end among both ends of the first coil 120, and the second lower elastic member 160b may electrically be connected to the other among the both ends of the first coil 120 such that external current and/or voltage is applied to the first lower elastic member 160a and the second lower elastic member 160b. To this end, at least one selected from between the inner frame 161 and the outer frame 162 of the lower elastic member 160 may include at least one terminal portion electrically connected to at least one selected from between the first coil 120 of the bobbin 110 and the first circuit board 170. The both ends of the first coil 120 may be arranged opposite to each other with respect to the bobbin 110. Alternatively, the both ends of the first coil 120 may be arranged adjacent to each other.

Meanwhile, the upper elastic member 150, the lower elastic member 160, the bobbin 110, and the housing member 140 may be assembled by thermal fusion and/or by bonding using an adhesive. At this time, thermal fusion may be performed, and then bonding using the adhesive may be performed according to an assembly sequence, in order to finish the fixing works.

In another embodiment, the upper elastic member 150 may be configured to have a two-division structure as shown in FIG. 8, and the lower elastic member 160 may be configured to an integrated structure as shown in FIG. 7.

Figure 15:
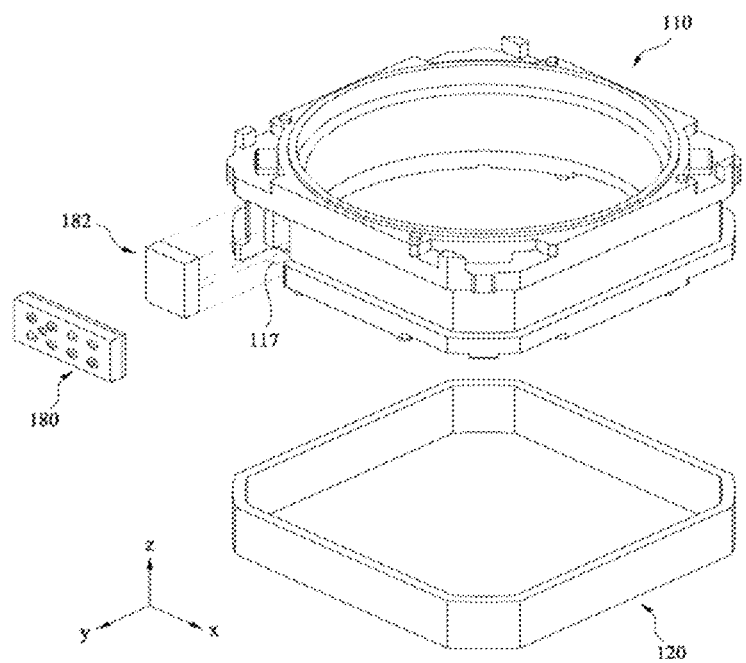
FIG. 15 is an exploded perspective view showing a bobbin, a first coil, a displacement sensing unit, and a sensing magnet according to an embodiment.
Figure 16:
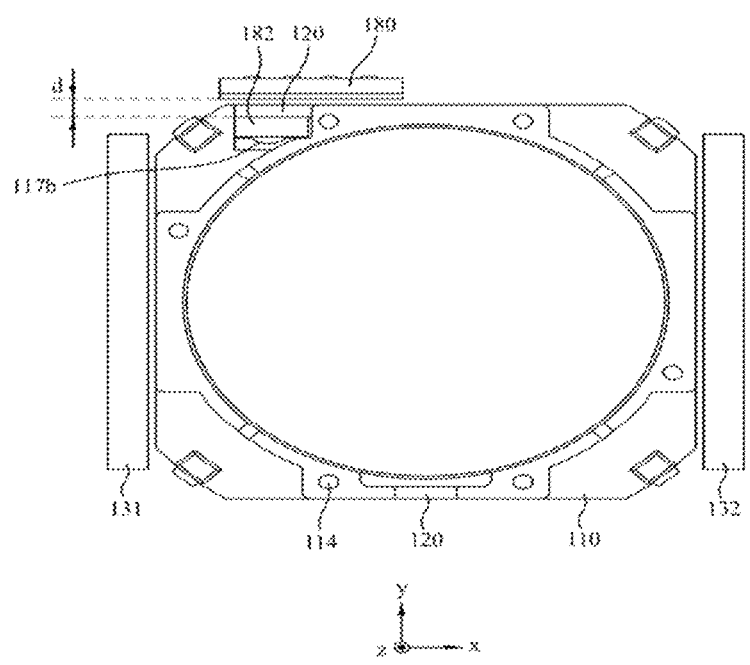
FIG. 16 is a bottom perspective view showing a bobbin, a first coil, first and second driving magnets, a displacement sensing unit, and a sensing magnet according to an embodiment.

FIG. 15 is an exploded perspective view showing a bobbin 110, a first coil 120, a displacement sensing unit 180, and a sensing magnet 182 according to an embodiment, and FIG. 16 is a bottom perspective view showing a bobbin 110, a first coil 120, first and second driving magnets 131 and 132, a displacement sensing unit 180, and a sensing magnet 182 according to an embodiment.

The bobbin 110 may be installed in an internal space of the housing member 140 such that the bobbin 110 can reciprocate in the optical axis direction. The first coil 120 may be installed at the outer circumferential surface of the bobbin 110 such that the bobbin 110 can reciprocate in the optical axis direction, i.e. the first direction through electromagnetic interaction between the first coil and the driving magnet 130 of the housing member 140.

In addition, the bobbin 110 may be flexibly (or elastically) supported by the upper elastic member 150 and the lower elastic member 160 such that the bobbin 110 moves in the optical axis direction, i.e. the first direction, to perform an auto focusing function.

Although not shown, at least one lens may be mounted to, inserted in, seated at, contacted to, coupled to, fixed to, temporarily fixed to, supported at, or located at the inside of the bobbin 110. For example, the bobbin 110 may include a lens barrel (not shown). The lens barrel is a component of a camera module, which will hereinafter be described. The lens barrel may not an indispensable component of the lens moving apparatus. The lens barrel may be mounted to, inserted in, seated at, contacted to, coupled to, fixed to, temporarily fixed to, supported at, or located at the inside of the bobbin 110 in various fashions. For example, a female screw thread may be formed at the inner circumferential surface of the bobbin 110, and a male screw thread corresponding to the female screw thread may be formed at the outer circumferential surface of the lens barrel such that the lens barrel is coupled to the bobbin 110 by screw engagement therebetween. However, the disclosure is not limited thereto. The lens barrel may be directly fixed to the inside of the bobbin 110 using methods other than screw engagement.

Alternatively, one or more lenses may be integrally formed with the bobbin 110 without the lens barrel. One lens may be coupled to the lens barrel, or two or more lenses may be provided to constitute an optical system.

In addition, a plurality of upper supporting protrusions 113 and a plurality of lower supporting protrusions 114 may be formed at the upper surface and the lower surface of the bobbin 110, respectively, in a protruding state. As shown in FIG. 13, the upper supporting protrusions 113 may be formed in a cylindrical shape or in a prism shape. The inner frame 151 of the upper elastic member 150 may be coupled to, fixed to, temporarily fixed to, contacted to, or supported at the bobbin 110 through the upper supporting protrusions 113. According to the embodiment, second through holes 151a may be formed at positions of the inner frame 151 of the upper elastic member 150 corresponding to the upper supporting protrusions 113. At this time, the upper supporting protrusions 113 may be fixed to the second through holes 151a by thermal fusion or using an adhesive member, such as epoxy. A plurality of upper supporting protrusions 113 may be provided. At this time, the distance between the respective upper supporting protrusions 113 may be appropriately set within a range in which interference with surrounding components is avoided. That is, the upper supporting protrusions 113 may be located at regular intervals in a state of being symmetric with respect to the center of the bobbin 110. Alternatively, the upper supporting protrusions 113 may be arranged symmetrically with respect to a specific imaginary light passing through the center of the bobbin 110 although the upper supporting protrusions 113 are not located at regular intervals.

As shown in FIG. 14, the lower supporting protrusions 114 may be formed in a cylindrical shape or in a prism shape in the same manner as in the upper supporting protrusions 113. The inner frame 161 of the lower elastic member 160 may be coupled to, fixed to, temporarily fixed to, contacted to, or supported at the bobbin 110 through the lower supporting protrusions 114. According to the embodiment, third through holes 161a may be formed at positions of the inner frame 161 of the lower elastic member 160 corresponding to the lower supporting protrusions 114. At this time, the lower supporting protrusions 114 may be fixed to the third through holes 161a by thermal fusion or using an adhesive member, such as epoxy. A plurality of lower supporting protrusions 114 may be as shown in FIG. 14. At this time, the distance between the respective lower supporting protrusions 114 may be appropriately set within a range in which interference with surrounding components is avoided. That is, the lower supporting protrusions 114 may be located at regular intervals in a state of being symmetric with respect to the center of the bobbin 110.

Upper escape recesses 112 and lower escape recesses 118 may be formed at positions of the upper surface and the lower surface of the bobbin 110 corresponding to the connection part 153 of the upper elastic member 150 and the connection part 163 of the lower elastic member 160, respectively.

In a case in which the upper escape recesses 112 and the lower escape recesses 118 are provided, spatial interference between the connection parts 153 and 163 and the bobbin 110 is avoided when the bobbin moves with respect to the housing member 140 in the first direction, thereby more easily achieving elastic deformation of the connection parts 153 and 163. In addition, as shown in FIG. 13, the upper escape recesses 112 may be located at corners of the housing member 140. Alternatively, the upper escape recesses 112 may be located at lateral surfaces of the housing member 140 based on the shape and/or position of the connection parts of the elastic member.

In addition, a coil seating recess 116, which the first coil 120 is mounted to, inserted in, seated at, contacted to, coupled to, fixed to, temporarily fixed to, supported at, or located at, may be provided at the outer circumferential surface of the bobbin 110. However, the disclosure is not limited thereto. That is, in another embodiment, instead of the first coil 120 being directly mounted to, inserted in, seated at, contacted to, coupled to, fixed to, temporarily fixed to, supported at, or located at the outer circumferential surface of the bobbin 110, a coil ring (not shown) having the same shape as the outer circumferential shape of the bobbin 110 may be mounted to, inserted in, seated at, contacted to, coupled to, fixed to, temporarily fixed to, supported at, or located adjacently at the outer circumferential surface of the bobbin 110, and the first coil 120 may be mounted to, inserted in, seated at, contacted to, coupled to, fixed to, temporarily fixed to, supported at, or located at the coil ring.

The first coil 120 may be provided as a ring-shaped coil block that is mounted to, inserted in, seated at, contacted to, coupled to, fixed to, temporarily fixed to, supported at, or located at the outer circumferential surface of the bobbin 110 or the coil seating recess 116. However, the disclosure is not limited thereto. The first coil 120 may be directly wound on the outer circumferential surface of the bobbin 110 or the coil seating recess 116. In a case in which the first coil 120 is mounted to, inserted in, or located at the bobbin 110 in a state of being pre-wound, the first coil 120 may be mounted to, inserted in, or located at the bobbin 110 from above or under the bobbin 110.

According to the embodiment, the first coil 120 may be formed approximately in an octagonal shape as shown in FIG. 15. The shape of the first coil 120 may correspond to the shape of the outer circumferential surface of the bobbin 110. The bobbin may also be formed in an octagonal shape. In addition, at least four surfaces of the first coil 120 may be linear, and the corners connected between the respective surfaces of the first coil 120 may be round or linear. At this time, the linear surfaces may be surfaces facing the driving magnet 130. In addition, the surface of the driving magnet 130 facing the first coil 120 may have the same curvature as the first coil 120. That is, in a case in which the first coil 120 is linear, the corresponding surface of the driving magnet 130 may be linear. In a case in which the first coil 120 is curved, the corresponding surface of the driving magnet 130 may be curved. In addition, the corresponding surface of the driving magnet 130 may have the same curvature as the first coil 120. Alternatively, even in a case in which the first coil 120 is curved, the corresponding surface of the driving magnet 130 may be linear, or vice versa.

The first coil 120 moves the bobbin 110 in the optical axis direction to perform an auto focusing function. When electric current is supplied to the first coil 120, the first coil 120 may electromagnetically react with the driving magnet 130 to generate electromagnetic force. The generated electromagnetic force moves the bobbin 110 as previously described.

Meanwhile, the first coil 120 may be configured to correspond to the driving magnet 130. In a case in which the driving magnet 130 is embodied in a single body as shown such that the entirety of the surface of the driving magnet 130 opposite to the first coil 120 has the same polarity, the first coil 120 may be configured such that the surface of the first coil 120 corresponding to the driving magnet 130 has the same polarity. Meanwhile, although not shown, in a case in which the driving magnets 130 is divided into two parts on a plane perpendicular to the optical axis such that two or more surfaces of the driving magnets 130 are opposite to the first coil 120, the first coil 120 may be divided into parts corresponding to the divided parts of the driving magnets 130.

Meanwhile, the lens moving apparatus 100A or 100B may further include a sensing magnet 182. The sensing magnet 182 may be mounted to, inserted in, seated at, contacted to, coupled to, fixed to, temporarily fixed to, supported at, or located at the bobbin 110. As a result, during the movement of the bobbin 110 in the first direction, the sensing magnet 182 may move in the first direction by the same amount of displacement as the bobbin 110. In addition, the sensing magnet 182 may be integrally formed at the bobbin 110, and may be located such that an N pole of the sensing magnet 182 faces the upper portion of the bobbin 110, and an S pole of the sensing magnet 182 faces the lower portion of the bobbin 110. However, the disclosure is not limited thereto. The sensing magnet 182 may be integrally formed at the bobbin 110, and may be located such that an S pole of the sensing magnet 182 faces the upper portion of the bobbin 110, and an N pole of the sensing magnet 182 faces the lower portion of the bobbin 110.

In addition, the sensing magnet 182 may be divided into two parts on a plane perpendicular to the optical axis. As shown in FIGS. 13 to 16, the bobbin 110 may be further provided at the outer circumferential surface thereof with a receiving recess 117 for receiving the sensing magnet 182.

The receiving recess 117 may be formed inward in the bobbin 110 from the outer surface of the bobbin 110 by a predetermined depth. Specifically, the receiving recess 117 may be formed at one lateral surface of the bobbin such that at least a portion of the receiving recess 117 is located inside the first coil 120.

In addition, at least a portion of the receiving recess 117 may be formed in the bobbin 110 by a predetermined depth in a concave state so as to be located more inward than the coil seating recess 116. In a case in which the receiving recess 117 is formed in the bobbin 110 as described above, the sensing magnet 182 may be received in the bobbin 110. As a result, it is not necessary to secure an additional installation space for the sensing magnet 182, thereby improving spatial efficiency of the bobbin 110.

In particular, the receiving recess 117 may be located at a position of the housing member 140 corresponding to the displacement sensing unit 180 or opposite to the position sensing unit 180. Consequently, the displacement sensing unit 180 and the sensing magnet 182 may be aligned on the same axis.

A distance d between the sensing magnet 182 and the displacement sensing unit 180, which is the sum of the thickness of the first coil 120 and the distance between the first coil 120 and the displacement sensing unit 180, may be minimized, thereby improving accuracy in sensing of magnetic force performed by the displacement sensing unit 180.

More specifically, as shown in FIGS. 13 to 16, the receiving recess 117 may include an inner surface for supporting one surface of the sensing magnet 182 and an adhesive recess 117b formed more inward than the inner surface by a predetermined depth in a concave state such that an adhesive is injected into the adhesive recess 117b.

The inner surface of the receiving recess 117 is one surface of the receiving recess 117 located inward toward the center of the bobbin 110. In a case in which the sensing magnet 182 is formed in a rectangular hexahedral shape, the inner surface of the receiving recess 117 is a surface of the receiving recess 117 which the wide surface of the sensing magnet 182 contacts or is seated at.

The adhesive recess 117b may be a recess formed at a portion of the inner surface of the receiving recess 117 in a concave state so as to be deeply located more inward toward the center of the bobbin 110. The adhesive recess 117b may be formed up to one surface of the inside of the bobbin 110, which one surface of the sensing magnet 182 is mounted to, inserted in, seated at, contacted to, coupled to, fixed to, temporarily fixed to, supported at, or located at.

In another embodiment, the receiving recess 117 may be formed such that the distance between the inner surface of the receiving recess 117, at which one surface (i.e. the wide surface) of the sensing magnet 182 is supported, and the outer circumferential surface (i.e. the surface of the coil seating recess 116) of the bobbin, at which the first coil 120 is provided, is equal to or less than the thickness of the sensing magnet 182. As a result, the sensing magnet 182 may be fixed in the receiving recess 117 due to force that the first coil 120 applies inward when winding the first coil 120. In this case, it may be unnecessary to use an adhesive.

In a further embodiment, although not shown, the bobbin 110 may further include an additional receiving recess 117 formed at another outer circumferential surface of the bobbin 110 opposite to the outer circumferential surface at which the receiving recess 117 is formed, in a state in which the additional receiving recess 117 and the receiving recess 117 are symmetric with respect to the center of the bobbin 110 and a weight balance member received in the additional receiving recess 117.

According to the embodiment, the sensing magnet 182 may be omitted. In this case, the driving magnet 130 may be used instead of the sensing magnet 182.

In the embodiment described above, it is possible to readjust the position of the lens in the optical direction through feedback of the amount of displacement of the lens in the optical direction using the result sensed by the displacement sensing unit 180, thereby shortening focus adjustment time of the lens.

In addition, in the embodiments, it is possible to minimize the distance between the sensing magnet 182 provided at the bobbin, which is a moving body, and the displacement sensing unit 180 provided at the housing member 140, which is a stationary body, and to more accurately sense the amount of displacement of the lens in the optical direction, thereby more accurately positioning the lens at the focal distance of the lens.

In addition, in the embodiments, the sensing magnet 182 may be mounted to, seated at, contacted to, fixed to, temporarily fixed to, coupled to, supported at, or located at the inside of the bobbin 110, and the displacement sensing unit 180 may be mounted to, seated at, contacted to, fixed to, temporarily fixed to, coupled to, supported at, or located at the inside of the housing member 140. Consequently, it is not necessary to secure an additional installation space for the displacement sensing unit 180, thereby improving spatial efficiency of the camera module (specifically, the bobbin).

Camera Module

Meanwhile, the lens moving apparatus 100A or 100B according to the embodiment described above may be used for various fields, such as a camera module. For example, the camera module may be applied to mobile devices, such as a mobile phone.

A Camera Module According to an Embodiment

A camera module according to an embodiment may include the lens moving apparatus 100A or 100B with the above-stated construction, a lens mounted to, inserted in, seated at, contacted to, coupled to, fixed to, supported at, or located at the lens moving apparatus 100A or 100B, an image sensor (not shown), a second circuit board (not shown) (or a main circuit board) having the image sensor located thereon, and an optical system. The camera module according to the embodiment may further include a lens barrel coupled to the bobbin 110.

The lens barrel has a structure described above, and the second circuit board, which is a portion on which the image sensor is mounted, may form a bottom surface of the camera module. In addition, the optical system may include at least one lens for transmitting an image to the image sensor.

In addition, the camera module may further include a camera module controller (not shown). In this case, the camera module controller may compare a first displacement value calculated based on a variation value of electric current sensed by the displacement sensing unit 180 with a focal distance of the lens based on the distance between a subject and the lens. In a case in which the first displacement value or the current position of the lens does not correspond to the focal distance of the lens, the camera module controller may readjust the amount of electric current that is applied to the first coil 120 of the bobbin 110 to move the bobbin 110 by a second displacement value in a first direction. In addition, the displacement sensing unit 180 fixed and coupled to the housing member 140, which is a stationary body, may sense the change in magnetic force emitted from the sensing magnet 182 fixed and coupled to the bobbin 110, which is a moving body, according to the movement of the sensing magnet 182 in the first direction, and an additional drive IC or the camera module controller may calculate or determine the current position or a first variation amount of the bobbin 110 based on a variation amount of electric current output based on a variation amount of the sensed magnetic force. The calculated or determined current position or first variation amount of the bobbin 110 may be transmitted to the controller of the first circuit board 170, and the controller may readjust the position of the bobbin 110 for auto focusing to control the amount of electric current that is supplied to the first coil 120.

Meanwhile, an actuator module for performing an auto focusing function and a handshake correction function may be installed in the optical system. The actuator module for performing the auto focusing function may be variously configured. A voice coil unit motor is generally used. The lens moving apparatus 100A or 100B according to the above-described embodiment may correspond to an actuator module for performing an auto focusing function. However, the disclosure is not limited thereto. The lens moving apparatus 100A or 100B according to the above-described embodiment may be applied to actuator module that performs both an auto focusing function and a handshake correction function.

Although not shown, in a case in which a second coil (not shown), a supporting member (not shown), and a plurality of sensing units (not shown) are added to the lens moving apparatus 100A or 100B that performs an auto focusing function, the lens moving apparatus 100A or 100B may also perform handshake correction function in addition to the auto focusing function. The second coil may be located opposite to the driving magnet. That is, the second coil may be located such that the second coil is directly opposite to the bottom surface of the driving magnet 130, each of the sensing units may be embodied by a Hall sensor, and each of the sensing units, the second coil, and the driving magnet may be arranged on the same axis. Consequently, the second coil may move the housing member 140, to which the bobbin 110 is mounted, in a second direction and/or a third direction through reaction with the driving magnet 130 to perform handshake correction.

A supporting member may be located at the upper surface of the base 190a or 190b for flexibly (or elastically) supporting the horizontal movement of the housing member 140 moving in a direction perpendicular to the first direction.

In addition, the camera module may further include an infrared cut-off filter (not shown). The infrared cut-off filter functions to inhibit infrared light from being incident upon the image sensor. In this case, the infrared cut-off filter may be installed at a position of the base 190a or 190b shown in FIG. 2 or 12 corresponding to the image sensor. The infrared cut-off filter may be coupled to a holder member (not shown). In addition, the base 190a or 190b may support a lower side of the holder member.

An additional terminal member for electric conduction with the second circuit board member may be installed at the base 190a or 190b. A terminal may also be integrally formed at the base 190a or 190b using a surface electrode. Meanwhile, the base 190a or 190b may function as a sensor holder for protecting the image sensor. In this case, a protrusion may be formed downward along the lateral surface of the base 190a or 190b. However, the above-described components are not indispensable. Although not shown, an additional sensor holder may be located at the lower portion of the base 190a or 190b for performing the function.

In a lens moving apparatus according to an embodiment or another embodiment and a camera module including the same according to an embodiment, a cover can or a cover may electrically be connected to a second circuit board. Consequently, it is possible to shield electromagnetic interference including electrical noise generated from a coil or various sensors.

A Camera Module According to Another Embodiment

A camera module according to another embodiment may include a lens moving apparatus 100A or 100B and a focus controller 300. A description of components of the camera module corresponding to the lens moving apparatus 100A or 100B will be omitted, and only components of the camera module other than the lens moving apparatus 100A or 100B will be described. In addition, components of the camera module according to this embodiment corresponding to those of the camera module according to the previous embodiment will be omitted, and only components of the camera module according to this embodiment other than those of the camera module according to the previous embodiment will be described. Consequently, the previous description of the lens moving apparatus 100A or 100B and the camera module which will not be described hereinafter may be applied to the camera module according to this embodiment.

The lens moving apparatus 100A or 100B according to the embodiment may be controlled by a focus controller 300, which will hereinafter be described, such that the distance between the lens (not shown) and the image sensor (not show) is adjusted, whereby the image sensor is positioned at the focal distance of the lens. That is, the focus controller 300 may perform an 'auto focusing function' of automatically focusing the lens in the lens moving apparatus 100A or 100B.

The focus controller 300 may be included in the first circuit board 170 previously described. For example, the focus controller 300 may receive signals from the 2-1 and 2-2 pins of the Hall sensor 180 as position information. The focus controller 300 may be mounted on the first circuit board 170. In another embodiment, the focus controller 300 may not be mounted on the first circuit board 170 but may be mounted on an additional circuit board. The additional circuit board may be a second circuit board (not shown), on which the image sensor (not shown) is mounted, of the camera module, or another circuit board.

In addition, the lens moving apparatus 100A or 100B according to the previous embodiment may correspond to an actuator module for performing an auto focusing function under control of the focus controller 300.

Hereinafter, the construction and operation of the focus controller 300 will be described with reference to FIGS. 17 to 21. For the sake of convenience, the focus controller 300 will be described with reference to the aforementioned lens moving apparatus 100A or 100B. However, the disclosure is not limited thereto. That is, the focus controller 300 according to the embodiment may be applied to a lens moving apparatus having a structure different from that of the lens moving apparatus 100A or 100B described above to perform an auto focusing function. That is, the focus controller 300 may be applied to a lens moving apparatus having any structure to perform an auto focusing function so long as the lens moving apparatus can move the bobbin 110 in the optical axis direction through interaction between the first coil 120 and the driving magnet 130.

Figure 17:
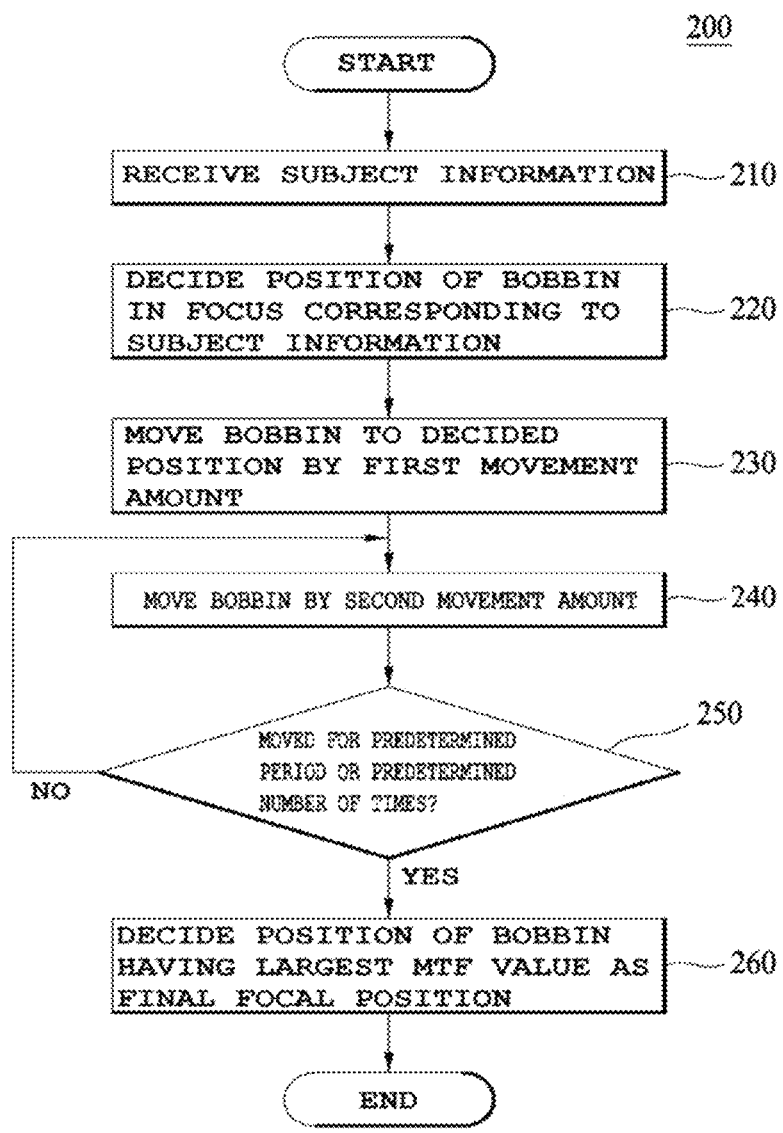
FIG. 17 is a flowchart illustrating an auto focusing function performed by a focus controller of a camera module according to a further embodiment.
Figure 18:
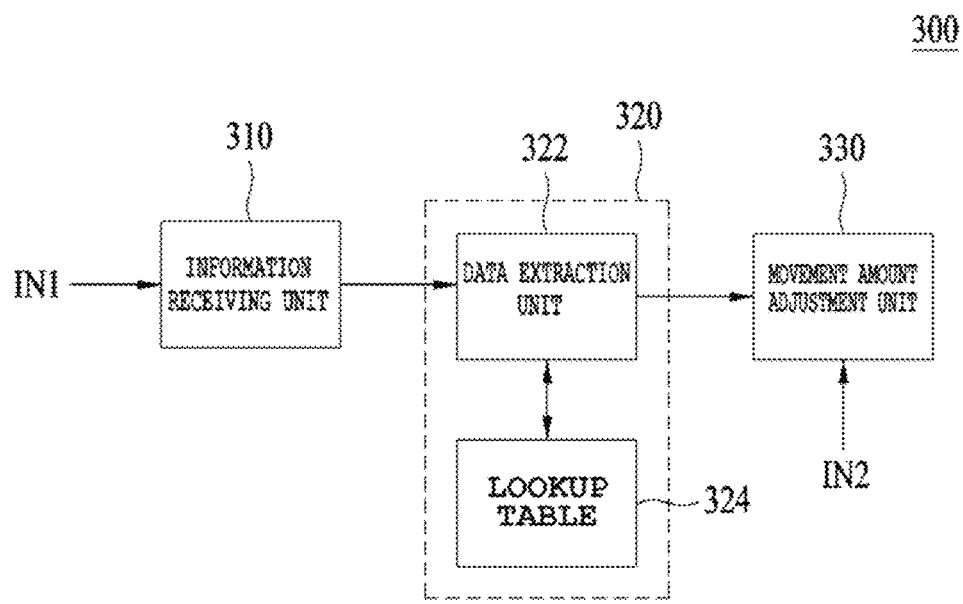
FIG. 18 is a block diagram showing a focus controller according to an embodiment.

FIG. 17 is a flowchart illustrating an auto focusing function (or a method of performing an auto focusing function) 200 performed by a focus controller 300 of a camera module according to a further embodiment, and FIG. 18 is a block diagram showing a focus controller 300 according to an embodiment.

Referring to FIGS. 17 and 18, the focus controller 300 may control interaction between the first coil 120 and the driving magnet 130 based on subject information and position information output from the position sensing unit 180 to move the bobbin 110 in a first direction parallel to the optical axis by a first movement amount (or a first displacement amount), thereby performing an auto focusing function. To this end, the focus controller 300 may include an information receiving unit 310, a bobbin position retrieval unit 320, and a movement amount adjustment unit 330.

The position sensing unit 180 may sense the position of the bobbin 110 in the optical axis direction, and may output the sensed result to the movement amount adjustment unit 330 as position information.

The information receiving unit 310 may receive subject information through an input terminal IN1 (210). The subject information may include at least one selected from among the distance between a subject and at least one lens (not shown), the distance between the subject and the image sensor, the position of the subject, and the phase of the subject. The subject information may be acquired using various methods.

In an embodiment, the subject information may be acquired using two cameras.

In another embodiment, the subject information may be acquired using a laser. For example, Korean Patent Application Publication No. 1989-0008573 discloses a method of measuring the distance to an object using a laser.

In a further embodiment, the subject information may be acquired using a sensor. For example, US Patent Application Publication No. US2013/0033572 filed in the name of Sony discloses a method of acquiring the distance between a camera and a subject using a sensor.

The camera module may receive, be provided with, or obtain the aforementioned subject information from outside of the camera module. For example, in a case in which the camera module according to the embodiment is applied to a mobile terminal (or a portable terminal), the mobile terminal may acquire subject information, and the acquired subject information may be provided to the focus controller 300 of the camera module. At this time, the subject information may be provided to the information receiving unit 310 from the image sensor of the camera module. That is, the image sensor may provide the subject information to the information receiving unit 310 of the focus controller 300. In another embodiment, the subject information may be acquired by the camera module according to the embodiment.

After step 210, the bobbin position retrieval unit 320 may retrieve the position of the bobbin 110 in focus corresponding to the subject information received by the information receiving unit 310 (220). To this end, the bobbin position retrieval unit 320 may include a data extraction unit 322 and a lookup table (LUT) 324.

The lookup table 324 may store the position of the bobbin 110 in focus per subject information in a mapped state. For example, the position of the bobbin 110 in focus per distance between the subject and the lens may be acquired in advance, and may be stored in the form of the lookup table 324. That is, the lookup table 324 may be created in advance using the position sensing unit 180 before the bobbin 110 is moved by a first movement amount at step 230. For example, the position of the bobbin 110 per subject information may be calculated in advance based on a variation value of electric current sensed by the position sensing unit 180. Consequently, the position of the bobbin 110 in focus per the subject information, which is the distance between the subject and the lens, may be measured to create the lookup table 324. In addition, the lookup table 324 may code and store the position of the bobbin 110.

The data extraction unit 322 may receive the subject information from the information receiving unit 310, may extract the position of the bobbin 110 in focus corresponding to the subject information from the lookup table 324, and may output the extracted position of the bobbin 110 to the movement amount adjustment unit 330. In a case in which the position of the bobbin 110 is coded and stored in the lookup table 324 as described above, the data extraction unit 322 may retrieve a code value corresponding to the subject information from the lookup table 324.

After step 220, the movement amount adjustment unit 330 may move the bobbin 110 to the position retrieved by the bobbin position retrieval unit 320 by a first movement amount (or a first displacement amount) (230). At this time, the movement amount adjustment unit 330 may refer to position information that is output from the position sensing unit 180 and is received through an input terminal IN2. That is, the movement amount adjustment unit 330 may recognize the current position of the bobbin 110 based on the position information provided by the position sensing unit 180, and may move the bobbin 110 to a corresponding position from the recognized current position of the bobbin.

For example, the movement amount adjustment unit 330 may adjust the amount of electric current that is supplied to the first coil 120 to move the bobbin 110 by the first movement amount in the first direction. To this end, the amount of electric current per position of the bobbin 110 may be decided in advance.

For example, the position sensing unit 180 fixed and coupled to the housing member 140 may sense the change in magnetic force emitted from the sensing magnet 182 fixed and coupled to the bobbin 110, which is a moving body, according to the movement of the sensing magnet 182 in the first direction. At this time, the movement amount adjustment unit 330 may receive and check a variation amount of electric current output based on a variation amount of the magnetic force sensed by the position sensing unit 180 as position information, and may calculate or determine the current position of the bobbin 110 based thereon. In addition, the movement amount adjustment unit 330 may decide an amount of electric current to be supplied so as to move the bobbin 110 to a position, at which the bobbin 110 is in focus, by the first movement amount with reference to the calculated or determined current position of the bobbin 110.

The first coil 120 moves the bobbin 110 in the optical axis direction when the auto focusing function is executed. When electric current is supplied to the first coil 120, the first coil 120 may electromagnetically interact with the driving magnet 130 to generate electromagnetic force. The generated electromagnetic force moves the bobbin 110 as previously described.

Figure 19:
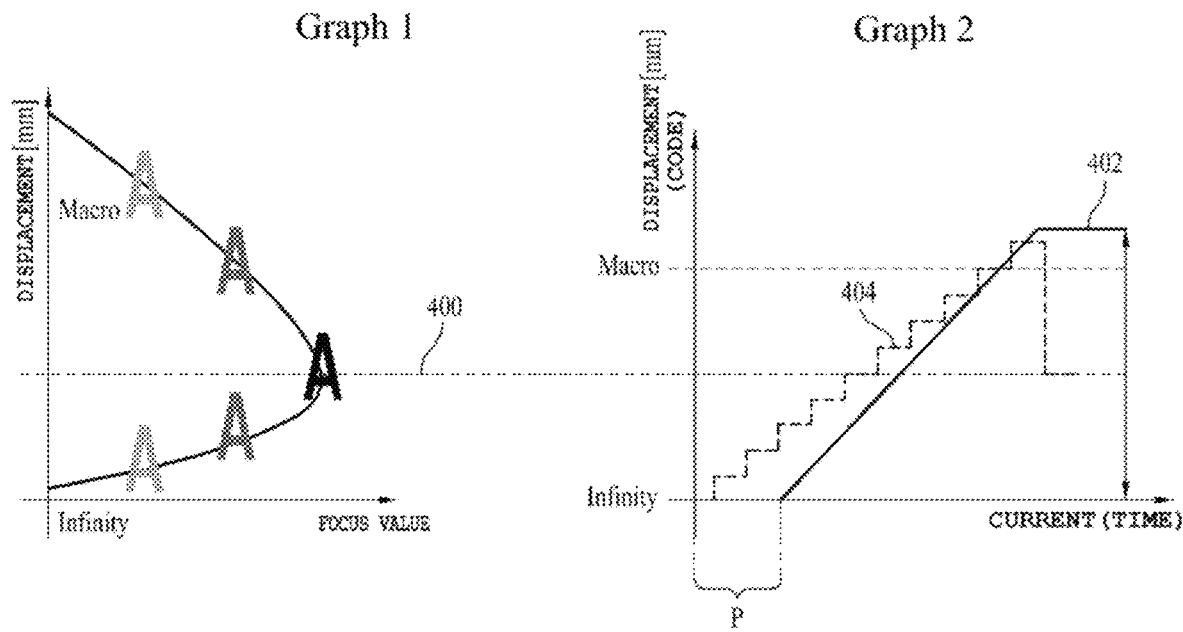
FIG. 19 Graph 1 and Graph 2 are graphs illustrating an auto focusing function according to a comparative example.

FIG. 19 Graph 1 and Graph 2 are graphs illustrating an auto focusing function according to a comparative example. In Graph 1 of FIG. 19, the horizontal axis indicates a focus value, and the vertical axis indicates displacement. In Graph 2 of FIG. 19, the horizontal axis indicates electric current (or time), and the vertical axis indicates displacement (or code).

Figure 20:
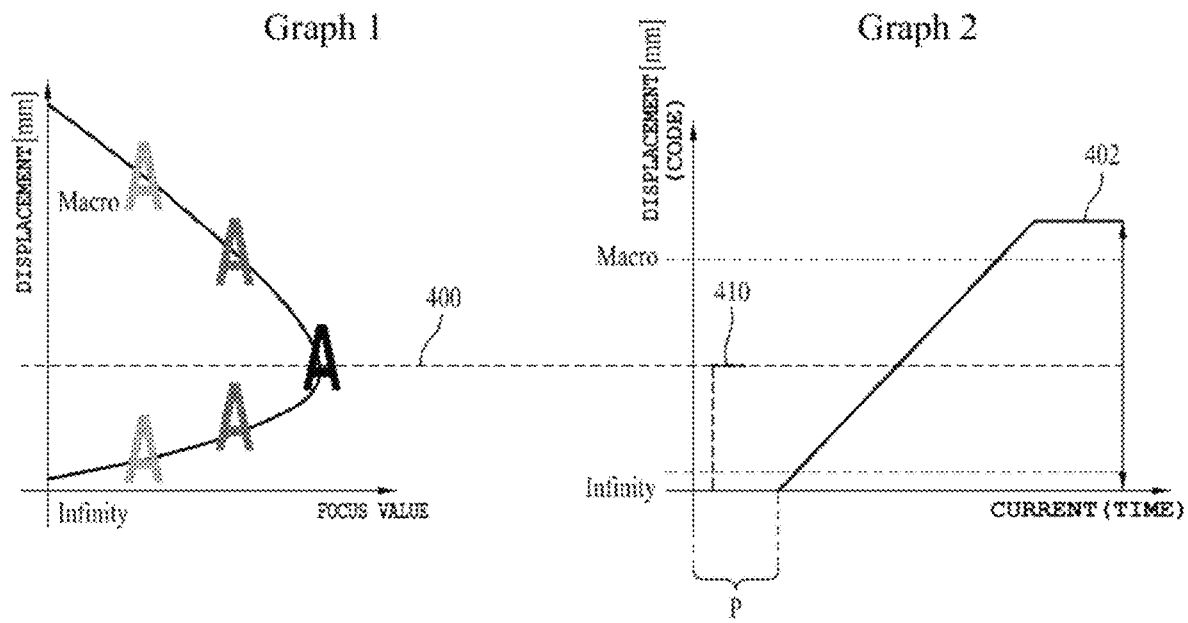
FIG. 20 Graph 1 and Graph 2 are graphs illustrating an auto focusing function according to an embodiment.

FIG. 20 Graph 1 and Graph 2 are graphs illustrating an auto focusing function according to an embodiment. In Graph 1 of FIG. 20, the horizontal axis indicates a focus value, and the vertical axis indicates displacement. In Graph 2 of FIG. 20, the horizontal axis indicates electric current (or time), and the vertical axis indicates displacement (or code).

Referring to FIG. 19 Graph 1 and Graph 2, with the increase of electric current, the position (or displacement) 400 of the bobbin 100 having the most proper focus (or in focus) is found from a first reference focal distance (infinity) at a position where the distance between the lens and the image sensor is the longest to a second reference focal distance (macro) at a position where the distance between the lens and the image sensor is the shortest. The bobbin 110 may not be driven for a predetermined period P during which electric current is initially supplied. Subsequently, as electric current 402 (or a code value 404 corresponding to a variation amount of magnetic force sensed by the position sensing unit 180) continuously increases, the displacement of the bobbin 110 increases. In the comparative example, the position 400 of the bobbin 110 having the most proper focus (or in focus) is found after the bobbin 110 is moved from the first reference focal distance to the second reference focal distance. As a result, a lot of time may be incurred.

Referring to FIG. 20 Graph 1 and Graph 2, on the other hand, a code corresponding to the position of the bobbin 110 having a proper focus (or in focus) is retrieved from the lookup table 324 using the subject information, and the bobbin 110 may be directly moved (410) to a corresponding focal position (or displacement) based thereon. As compared with the comparative example, therefore, time incurred in order for the lens to be in focus may be shortened.

Referring back to FIG. 17, the focus of the lens may be minutely adjusted after the focus of the lens is adjusted at steps 210 to 230 (240 to 260).

After moving the bobbin 110 by the first movement amount at step 230, the focus controller 300 may move the bobbin 110 within a range of a second movement amount which is less than the first movement amount to find the focal position 400 of the bobbin 110 showing the largest modulation transfer function (MTF) value (240). The MTF value may be a numerical value of resolving power.

After step 240, the focus controller 300 determines whether the bobbin 110 has been moved for a predetermined period to find the largest MTF value (250). Alternatively, the focus controller 300 may determine whether the bobbin 110 has been moved a predetermined number of times to find the largest MTF value (250). Otherwise, the bobbin 110 may be continuously moved for more than the predetermined period or more than the predetermined number of times until the largest MTF value is found.

Upon determining that the bobbin 110 has been moved for predetermined period or predetermined number of times, the focus controller 300 decides the position of the bobbin 110 showing the largest MTF value as a final focal position of the lens having a proper focus (260).

Figure 21:
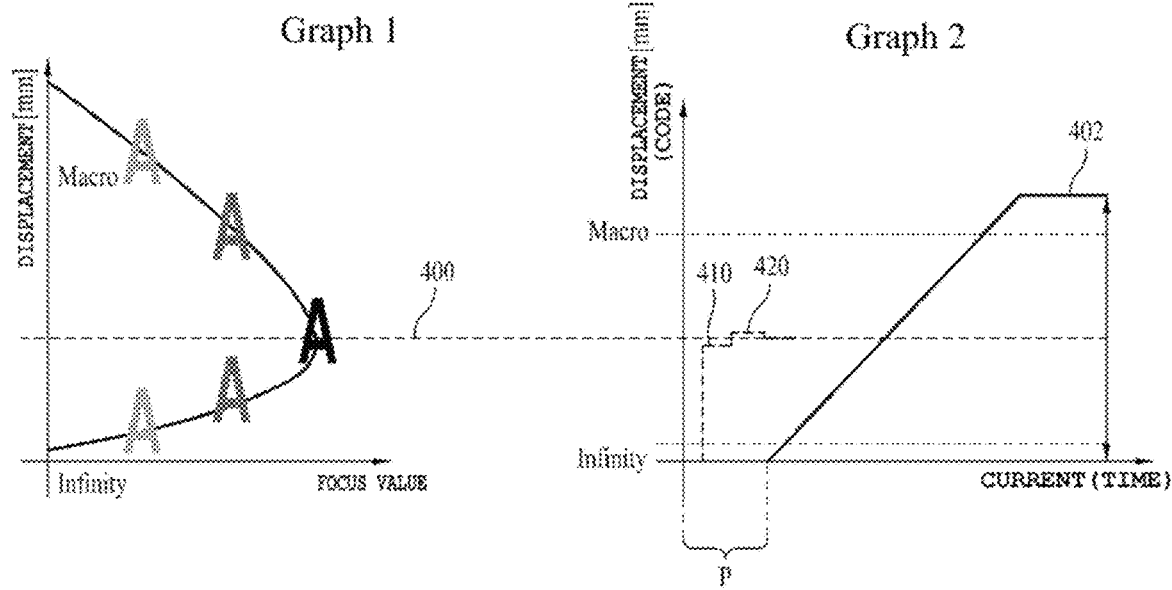
FIG. 21 Graph 1 and Graph 2 are graphs illustrating micro adjustment of the auto focusing function according to the embodiment.

FIG. 21 Graph 1 and Graph 2 are graphs illustrating micro adjustment of the auto focusing function according to the embodiment. In Graph 1 of FIG. 21, the horizontal axis indicates a focus value, and the vertical axis indicates displacement. In Graph 2 of FIG. 21, the horizontal axis indicates electric current (or time), and the vertical axis indicates displacement (or code).

Referring to FIG. 21 Graph 1 and Graph 2, after steps 210 to 230 are performed to primarily adjust the focus of the lens (410), steps 240 to 260 may be performed to minutely adjust the focus of the lens (420).

In the camera module according to the embodiment, the lens is accurately in focus by performing steps 240 to 260, thereby improving resolving power.

Consequently, it is possible for the camera module according to the embodiment to rapidly and accurately perform the auto focusing function.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A camera module, comprising:
a second circuit board;
an image sensor disposed on the second circuit board;
a base disposed on the second circuit board;
a cover can coupled to the base and comprising an upper plate and four side plates extending from the upper plate;
a bobbin disposed in the cover can;
at least one lens coupled to the bobbin;
a coil disposed on an outer surface of the bobbin;
at least two driving magnets disposed opposite to the coil and configured to move the bobbin in an optical axis direction of the at least one lens;
a first circuit; and
a displacement sensing unit disposed on the first circuit board,
wherein the displacement sensing unit is configured to supply current to the coil,
wherein the four side plates of the cover can comprise a first side plate adjacent to the first circuit board,
wherein the first side plate of the cover can comprises an area configured to be electrically connected to the second circuit board so that the cover can is grounded, and
wherein the area of the first side plate of the cover can is disposed at a position closer to the second circuit board than to the upper plate of the cover can.

2. The lens moving apparatus according to claim 1, wherein the at least two driving magnets include a first driving magnet and a second driving magnet opposite to the first driving magnet,
wherein the displacement sensing unit is configured to sense a displacement of the bobbin in the optical axis direction, and
wherein the displacement sensing unit is not overlapped with the at least two driving magnets in a direction from the first driving magnet toward the second driving magnet.

3. The lens moving apparatus according to claim 1, comprising a housing supporting the at least two driving magnets, and
wherein the bobbin is disposed on the housing.

4. The lens moving apparatus according to claim 1, comprising a lower elastic member coupled with a lower surface of the bobbin,
wherein the coil and the at least two driving magnets are configured to move the bobbin in the optical axis direction of the at least one lens through interaction therebetween.

5. The lens moving apparatus according to claim 1, wherein the first circuit board comprises a plurality of terminals electrically connected to the displacement sensing unit, and
wherein the plurality of terminals is soldered to the second circuit board.

6. The lens moving apparatus according to claim 1, wherein the first circuit board is disposed on a side surface of the base.

7. The lens moving apparatus according to claim 1, wherein a recess is formed at the first side plate of the cover can, and wherein the displacement sensing unit is not overlapped with the at least two driving magnets in a direction perpendicular to the first side plate of the cover can.

8. The lens moving apparatus according to claim 1, comprising a sensing magnet coupled to the bobbin and disposed at a position corresponding to the displacement sensing unit.

9. The camera module according to claim 1,
wherein the first circuit board comprises a shielding terminal configured to be electrically connected to the area of the first side plate of the cover can.

10. The lens moving apparatus according to claim 1, wherein the first circuit board is coupled to the second circuit board by a solder.

11. The lens moving apparatus according to claim 1, wherein at least a portion of the first circuit board is disposed on a side surface of the base, and
wherein the area of the first side plate of the cover can is disposed at a position closer to the base than to the upper plate of the cover can when viewed from a side.

12. The lens moving apparatus according to claim 1, wherein the first circuit board comprises a shielding terminal coupled to the second circuit board by a solder,
wherein the shielding terminal is disposed at a position closer to the base than to the upper plate of the cover can when viewed from a side, and
wherein at least a portion of the first circuit board is disposed on a side surface of the base.

13. The lens moving apparatus according to claim 1,
wherein the first circuit board comprises a plurality of terminals, and
wherein the plurality of terminals of the first circuit board comprises:
an upper terminal configured to be connected to the cover can; and
a lower terminal portion configured to be connected to the upper terminal portion.

14. The lens moving apparatus according to claim 13, wherein the upper terminal is connected to the area of the first side plate of the cover can by soldering, conductive epoxy, or welding, and
wherein the lower terminal portion is connected to the second circuit board by soldering, conductive epoxy, or welding.

15. The camera module according to claim 1, wherein the first circuit board electrically connects the area of the first side plate of the cover can to the second circuit board.

16. An optical device comprising the camera module according to claim 1.

17. A camera module, comprising:
a base;
a cover coupled to the base;
a bobbin disposed in the cover;
a coil disposed on an outer surface of the bobbin;
a driving magnet disposed opposite to the coil; and
a first circuit board configured to supply electric current to the coil,
wherein the cover includes an area electrically configured to be connected to a ground,
wherein the base includes two corners adjacent to one side plate of the cover; and
wherein the area of the cover is disposed closer to one of the two corners than to the other of the two corners.

18. The camera module according to claim 17, wherein the first circuit board comprises a shielding terminal including:

an upper terminal configured to be connected to the area of the cover; and a lower terminal configured to be connected to the upper terminal.

19. The camera module according to claim 18, wherein the upper terminal is connected to the cover by soldering, conductive epoxy, or welding, and wherein the lower terminal is connected to a ground by soldering, conductive epoxy, or welding.

20. The camera module according to claim 17, comprising:

a housing disposed in the cover;

a lens coupled to the bobbin;

a second circuit board; and an image sensor disposed on the second circuit board, wherein the first circuit board electrically connects the cover and the second circuit board.

\* \* \* \* \*